United States Patent
Suzuki

(10) Patent No.: US 8,786,086 B2
(45) Date of Patent: Jul. 22, 2014

(54) SEMICONDUCTOR DEVICE INCLUDING WIRING HAVING MAIN PORTION AND EXTENDED PORTION

(75) Inventor: Takashi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 857 days.

(21) Appl. No.: 12/639,565

(22) Filed: Dec. 16, 2009

(65) Prior Publication Data

US 2010/0164059 A1    Jul. 1, 2010

(30) Foreign Application Priority Data

Dec. 25, 2008   (JP) ................... 2008-329258

(51) Int. Cl.
*H01L 21/00*   (2006.01)
*H01L 21/768*  (2006.01)

(52) U.S. Cl.
CPC ..... *H01L 21/76804* (2013.01); *H01L 21/76832* (2013.01); *H01L 21/76807* (2013.01)
USPC ...................................................... 257/758

(58) Field of Classification Search
CPC .................. H01L 21/76804; H01L 21/76832; H01L 21/76831; H01L 21/76807; H01L 21/76834; H01L 21/76898; H01L 21/76877
USPC ..................................................... 257/758
See application file for complete search history.

(56) References Cited

U.S. PATENT DOCUMENTS

| | | | |
|---|---|---|---|
| 6,100,177 A | 8/2000 | Noguchi | |
| 6,476,496 B1 | 11/2002 | Izumitani | |
| 6,750,541 B2 * | 6/2004 | Ohtsuka et al. | 257/750 |
| 6,977,216 B2 * | 12/2005 | Kim | 438/622 |
| 7,026,235 B1 * | 4/2006 | Ben-Tzur et al. | 438/619 |
| 7,446,033 B2 * | 11/2008 | Lee et al. | 438/626 |
| 7,564,133 B2 | 7/2009 | Hamada et al. | |
| 7,709,905 B2 * | 5/2010 | McDevitt et al. | 257/396 |
| 7,732,294 B2 * | 6/2010 | Chinthakindi et al. | 438/381 |
| 7,955,970 B2 | 6/2011 | Sunayama et al. | |
| 8,350,386 B2 * | 1/2013 | Lin et al. | 257/758 |
| 8,358,007 B2 * | 1/2013 | Sohn et al. | 257/741 |
| 8,531,038 B2 * | 9/2013 | Lin | 257/778 |
| 2002/0048931 A1 * | 4/2002 | Farrar | 438/622 |
| 2003/0227089 A1 * | 12/2003 | Watanabe et al. | 257/758 |
| 2004/0021226 A1 * | 2/2004 | Geffken et al. | 257/758 |
| 2004/0195692 A1 * | 10/2004 | Adan | 257/758 |
| 2005/0212136 A1 * | 9/2005 | Karasawa et al. | 257/758 |
| 2006/0177630 A1 * | 8/2006 | Lee et al. | 428/123 |
| 2007/0007657 A1 * | 1/2007 | Hineman et al. | 257/758 |
| 2007/0085209 A1 * | 4/2007 | Lu et al. | 257/758 |

(Continued)

FOREIGN PATENT DOCUMENTS

| | | |
|---|---|---|
| JP | 9-321046 A | 12/1997 |
| JP | 2001-15508 A | 1/2001 |
| JP | 2006-203019 A | 8/2006 |

(Continued)

*Primary Examiner* — Nathan Ha

(74) *Attorney, Agent, or Firm* — Fujitsu Patent Center

(57) ABSTRACT

A semiconductor device includes a semiconductor substrate; an insulating film formed over the semiconductor substrate, there being formed in the insulating film a trench that in a sectional view has a stepped shape; and a wiring formed in the trench, wherein the wiring includes, a main portion with a first thickness; and an extended portion with a second thickness that is thinner than the first thickness and that extends outward from a side of the main portion.

15 Claims, 28 Drawing Sheets

(56) References Cited

U.S. PATENT DOCUMENTS

| | | | |
|---|---|---|---|
| 2007/0155152 A1* | 7/2007 | Kang, II | 438/597 |
| 2007/0158849 A1* | 7/2007 | Higashi et al. | 257/758 |
| 2008/0128910 A1* | 6/2008 | Lin et al. | 257/758 |
| 2008/0293210 A1* | 11/2008 | Chinthakindi et al. | 438/381 |
| 2013/0224947 A1* | 8/2013 | Noguchi et al. | 438/624 |

FOREIGN PATENT DOCUMENTS

| | | |
|---|---|---|
| JP | 2006-287086 | 10/2006 |
| WO | WO-2008/084524 A1 | 7/2008 |

* cited by examiner

SEMICONDUCTOR DEVICE INCLUDING WIRING HAVING MAIN PORTION AND EXTENDED PORTION

CROSS-REFERENCE TO RELATED APPLICATIONS

This application is based upon and claims the benefit of priority of the prior Japanese Patent Application No. 2008-329258, filed on Dec. 25, 2008, the entire contents of which are incorporated herein by reference.

FIELD

The present disclosure relates to a semiconductor device and manufacturing method thereof.

BACKGROUND

For semiconductor integrated circuit devices, miniaturization and higher-integration of Metal Oxide Semiconductor (MOS) transistor have been achieved. With the miniaturization of the transistor, a width of a wiring coupled to the transistor tends to be reduced. Operation speed of a semiconductor integrated circuit is limited by a resistance of a wiring and parasitic capacitance. In order to reduce a resistance of a narrow wiring, copper or copper alloy has been used instead of aluminum.

Improving patterning accuracy of a copper wiring is difficult. Therefore, a damascene method is employed that forms a trench in an inter-layer insulating film in which to bury a copper wiring. Copper has a property that degrades insulating characteristics of an insulating film when the copper is diffused in the insulating film. In order to prevent diffusion of copper, a barrier metal layer is formed over the surface of the trench, a copper wiring is buried in the concave part, unnecessary metal layers over the inter-layer insulating film are removed by chemical mechanical polishing (CMP) etc., and an insulating cap layer for preventing diffusion of copper such as SiN, SiCN, or SiC is formed.

With the advancement of higher-integration, problems such as voids are caused in a damascene copper wiring, and measures to tackle the problems have been studied.

Japanese Laid-open Patent Publication No. 2001-15508 points out that when an aspect ratio of a trench becomes large, the trench may not be filled with conductive material completely and this causes a cavity called a void, a phenomenon generally referred to as the step coverage problem. Japanese Laid-open Patent Publication No. 2001-15508 proposes controlling the increase in the aspect ratio by making a distance between side walls larger as the trench depth becomes greater.

Japanese Laid-open Patent Publication No. 2006-203019 points out that with miniaturization of a wiring, in the upper parts of the sides of a via and a trench, a barrier metal film becomes thicker whereas the barrier metal film becomes thinner in the lower parts of sides of the via and the trench, again due to the step coverage problem. Thus, a seed layer is not sufficiently deposited and that makes burying a Cu film by electrolytic plating difficult, and a buried failure such as a void is generated in a via. Thus, Japanese Laid-open Patent Publication No. 2006-203019 proposes to round a corner of a bottom of a trench.

Japanese Laid-open Patent Publication No. 2006-287086 points out that a wiring or a via plug can be damaged due to electric field concentration or physical stress. Japanese Laid-open Patent Publication No. 2006-287086 proposes making a barrier metal film covering the side surface of the via hole thicker than that of covering the bottom surface.

With the advancement of higher-integration, multi-layered wirings have been advanced as well. For example, multi-layered wirings that exceed ten layers have been used. A lower wiring near a transistor is narrow and thin, while an upper layer wiring is wide and thick. As integration advances, more power is required to be input to a chip. A power-supply wiring with lower resistance is desired and a thickness of the upper wiring tends to be increased.

There is a configuration to reduce power consumption of a small-sized portable device, etc., in which a DC-DC converter is provided to reduce a voltage when output from a power amplifier is low. In this application, an inductor that may flow, for example, a current of 100 mA order. Other applications may require an inductor that can flow a large current.

In order to obtain a wiring that enables to flow a large current, forming a thick wiring such as several microns thick may be desired. However, using such thick wirings which have not been used before causes new problems.

SUMMARY

According to an aspect of the invention, a semiconductor device includes a semiconductor substrate; an insulating film formed over the semiconductor substrate, there being formed in the insulating film a trench that in a sectional view has a stepped shape; and a wiring formed in the trench, wherein the wiring includes a main portion with a first thickness, and an extended portion with a second thickness that is thinner than the first thickness and that extends outward from a side of the main portion.

According to an another aspect of the invention, a semiconductor device manufacturing method includes: forming an insulating film over a substrate; forming a trench with a stepped shape in the insulating film; and forming a wiring layer in the trench, wherein the forming the wiring includes forming a main portion with a first thickness, and forming an extended portion so as to have a second thickness thinner than the first thickness and so as to extend outward from a side of the main portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

As a preliminary experiment, the inventor prepared a thick wiring of about 3.3 μm thick that has not been conventionally used and a conventional thick wiring of about 0.6 μm thick.

Figure 1A:
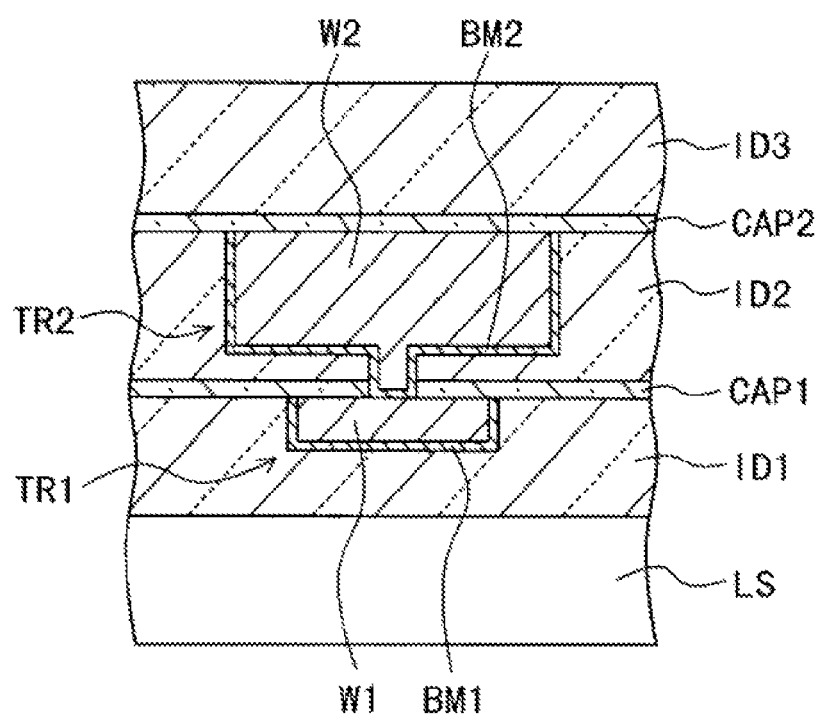
FIG. 1A is a cross-sectional view of a wiring structure prepared for preliminary experiments.

As illustrated in FIG. 1A, a first inter-layer insulating film ID1 such as silicon oxide with a thickness of about 0.8 μm is formed over a lower structure (LS) that includes a silicon substrate, and a first trench TR1 with a depth of about 0.6 μm is formed by etching. As a barrier metal film BM1, a Ta film with a thickness of about 20 nm is deposited by sputtering, as a plating seed layer, a Cu film with a thickness of about 50 nm is deposited by sputtering, a first Cu wiring layer W1 is formed by plating so that the trench TR1 is buried, and unnecessary metal layers on the first inter-layer insulating film ID1 are removed by Chemical Mechanical Polishing (CMP). A thickness of the first Cu wiring layer W1 the surface of which is planarized is about 0.6 μm. As a first insulating cap film CAP1 that substantially retards (if not prevents) diffusion of copper, for example, a SiC film with a thickness of about 140 nm is deposited over the inter-layer insulating film ID1 by covering the first Cu wiring layer W1. Hereafter, it is to be understood that discussion of diffusion prevention encompasses substantially retarding, if not preventing, diffusion.

As a second inter-layer insulating film ID2, for example, a silicon oxide film with a thickness of about 3.8 μm is deposited over the first insulating cap film CAP1, and a second trench TR2 with a dual damascene structure (with via holes) is formed by etching. The depth of a via hole is about 0.6 μm, and the depth of the trench is about 3.3 μm. As a barrier metal film BM2, for example, a Ta film with a thickness of about 20 nm is deposited by sputtering, as a plating seed layer, for example, a Cu film with a thickness of about 50 nm is deposited by sputtering, a second Cu wiring layer W2 is formed by plating so that the trench TR2 is buried, and unnecessary metal layers on the second inter-layer insulating film ID2 are removed by CMP. A thickness of the second Cu wiring layer W2 the surface of which is planarized is about 3.3 μm. As a second insulating cap film CAP2 that prevents diffusion of copper, for example, a SiC film with a thickness of about 70 nm is deposited by covering the second Cu wiring layer W2.

Figure 1B:
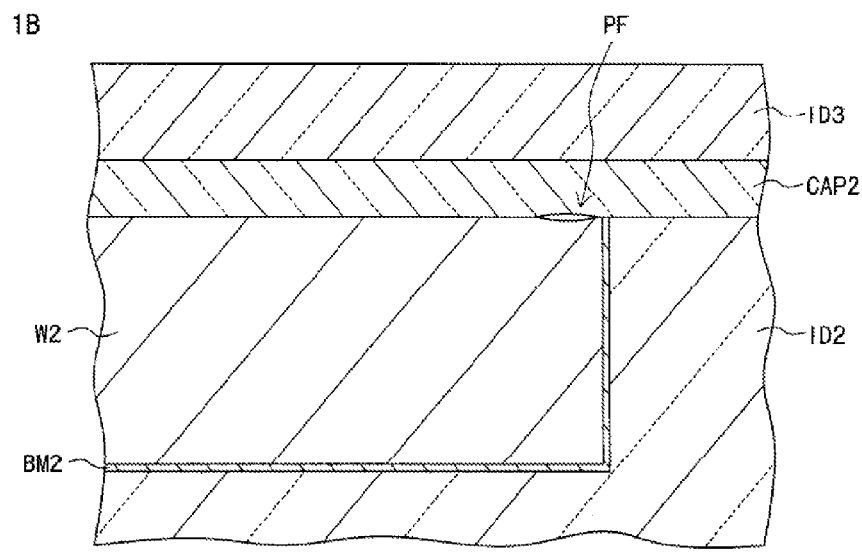
FIG. 1B is the enlarged part of the wiring structure.

FIG. 1B is an enlarged view around the second Cu wiring layer W2. A peeling PF is caused at the interface between the second Cu wiring layer W2 and the second cap layer CAP2 near the edge of the second Cu wiring layer W2. No peeling is caused at the interface between the first Cu wiring layer W1 and the first cap layer CAP1. Without being bound by theory, it is inferred that when a wiring becomes thicker, a peeling is likely to occur because no peeling is caused at the interface between the copper wiring with a thickness of about 0.6 μm and the cap layer, whereas the peeling is caused at the interface between the copper wiring with a thickness of about 3.3 μm and the cap layer. A peeling lowers reliability of a semiconductor device and becomes a factor to shorten the life, thus a technique to form a thick wiring without causing a peeling is desired.

In order to identify a cause of a peeling, the inventor performed stress analysis. In the stress analysis, as illustrated in FIG. 1B, a condition is assumed in which an infinitesimal peeling (crack) is caused at the interface between the Cu wiring and the cap layer near the edge of a Cu wiring, and the likelihood of development of the clack is evaluated using a stress intensity factor as an index. A larger index indicates the peeling is more likely to become larger. This method is often used in fracture mechanics. Stress intensity factors are calculated by changing a thickness of a Cu wiring t with an interval of about 900 nm from a conventionally used thick wiring of about 0.6 μm (about 600 nm) (model M1) to about 1,500 nm (model M2), to about 2,400 nm (model M3), and to about 3,300 nm (model M4).

Figure 1C:
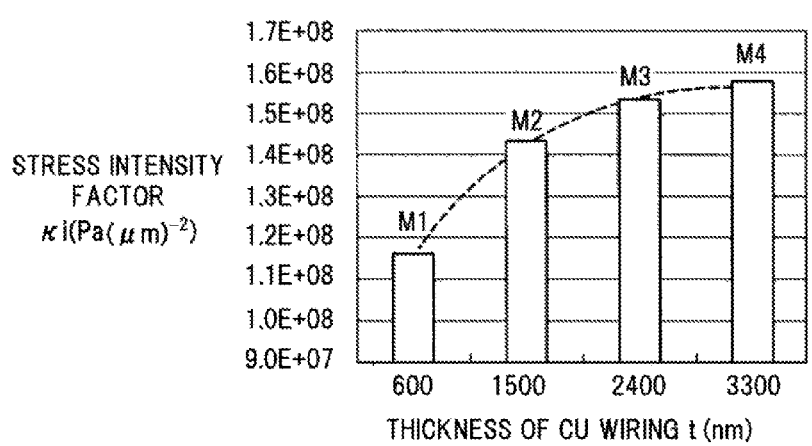
FIG. 1C is a graph illustrating stress intensity factors depending on thicknesses of a copper wiring.

FIG. 1C is a graph illustrating how stress intensity factors change depending on thicknesses of copper wiring layers. The horizontal axis indicates a thickness of a copper wiring layer t in nm, while the vertical axis indicates a stress intensity factor κi in $(Pa \cdot \mu m^{-2})$. It is found that the stress intensity factor κi increases with an increase of the thickness of the copper wiring t. As a whole, the graph is a convex shape. An increase in the stress intensity factor κi is the largest when the thickness t increases from about 600 nm to about 1500 nm. It is expected that forming a copper wiring thicker than about 600 nm sharply increases the applied stress. After that, an increase in a stress intensity factor κi corresponding to an increase in a thickness of a wiring layer gradually becomes smaller with an increase in the thickness at about 900 nm intervals. From the experiment results in which no peeling is caused in the copper wiring with the thickness of about 600 nm, whereas a peeling is caused in the copper wiring with a thickness of about 3,300 nm, the following is derived. That is no peeling causes at a stress intensity factor κi=1.16E8 $Pa \cdot \mu m^{-2}$ corresponding to the copper wiring with a thickness of about 600 nm, whereas a peeling causes at a stress intensity factor κi=2.12E8 $Pa \cdot \mu m^{-2}$ corresponding to the copper wiring with a thickness of about 3,300 nm.

Without being bound by theory, a possible cause of peeling will be discussed. In this model, Cu has a larger coefficient of thermal expansion than that of insulating materials $SiO_2$ and SiC that exist around the Cu. After forming a copper wiring layer, a cap layer and an inter-layer insulating film are deposited, for example, at about 400° C., and then lowers a temperature to a normal temperature. The copper wiring contracts more than the cap layer and the inter-layer insulating film during the temperature-lowering process.

Figure 2A:
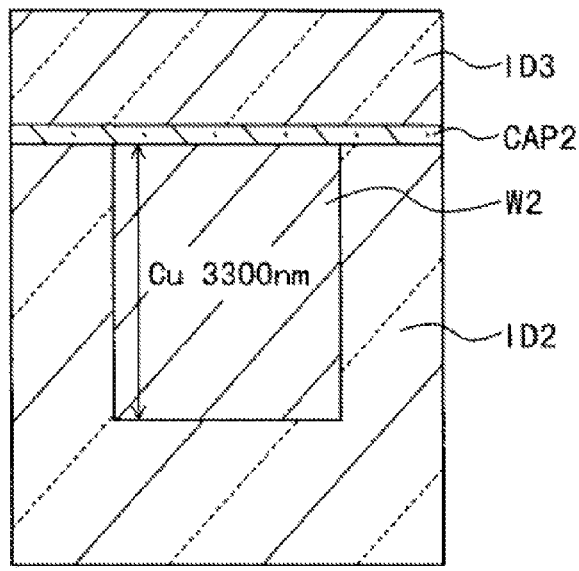
FIGS. 2A and 2B are schematic cross-sections for analyzing a process to form an upper insulating layer after forming a damascene copper wiring.

FIG. 2A is a simplified view illustrating a state that a second cap layer CAP 2, and a third inter-layer insulating film ID3 are formed over the second inter-layer insulating film ID2 in which a copper wiring W2 with a thickness of about 3,300 nm is buried. The temperature is about 400° C.

Figure 2B:
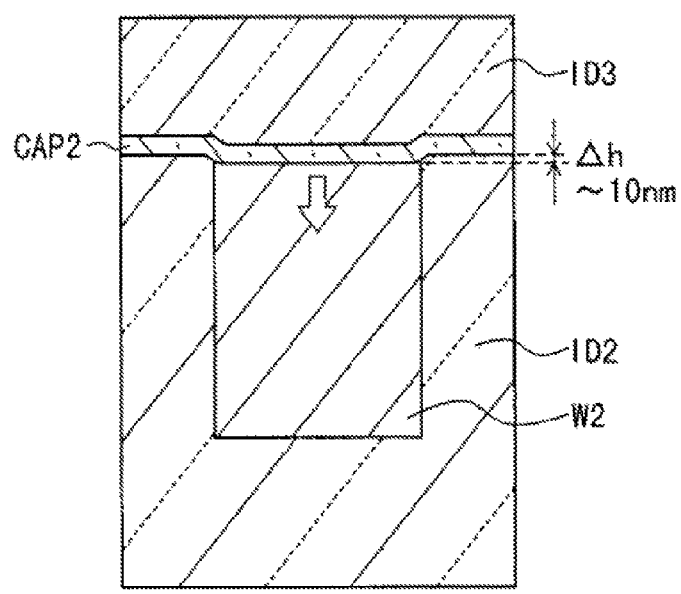

As illustrated in FIG. 2B, then the temperature is lowered to the room temperature. As the temperature lowers, the copper wiring W2 and the second inter-layer insulating film ID2 are thermally contracted. The amount of contraction of the copper wiring W2 is more than 10 times larger than that of the second inter-layer insulating film ID2. In the case of a copper wiring W2 with a thickness of about 3,300 nm, a difference in thermal contraction amount is as much as 10 nm for heightwise. When the height of the second copper wiring W2 surrounded by the second inter-layer insulating film ID2 is relatively lowered for 10 nm order, it is considered that the second cap layer CAP 2 is exposed to a relative height change of 10 nm order. Therefore, a large stress is applied to the cap layer CAP 2 near the edge of the copper wiring W2, and this may cause a peeling of the cap layer CAP 2 from the surface of the copper wiring W2. The stress is expected to become larger where a metal wiring and an insulating film are arranged adjacently and other insulating film covers the surface of the metal wiring and the insulating wiring.

Accordingly (and, again, without being bound by theory), the inventor considered strategies to reduce a height of a wiring that is substantially a cause of a strain in side wall portions of a wiring structure in contact with an inter-layer insulating film. For example, strain-relaxed regions are provided outside of side walls of a wiring structure. The lower part of the strain-relaxed region is the surrounding insulating film, and the upper part is an extended wiring region where wiring is continuously extended from the wiring structure by forming a step shape. The extended wiring region provides a reduced thickness; thereby a height change (amounts of thermal expansion and contraction) due to temperature change may be reduced as well.

Figure 3A:
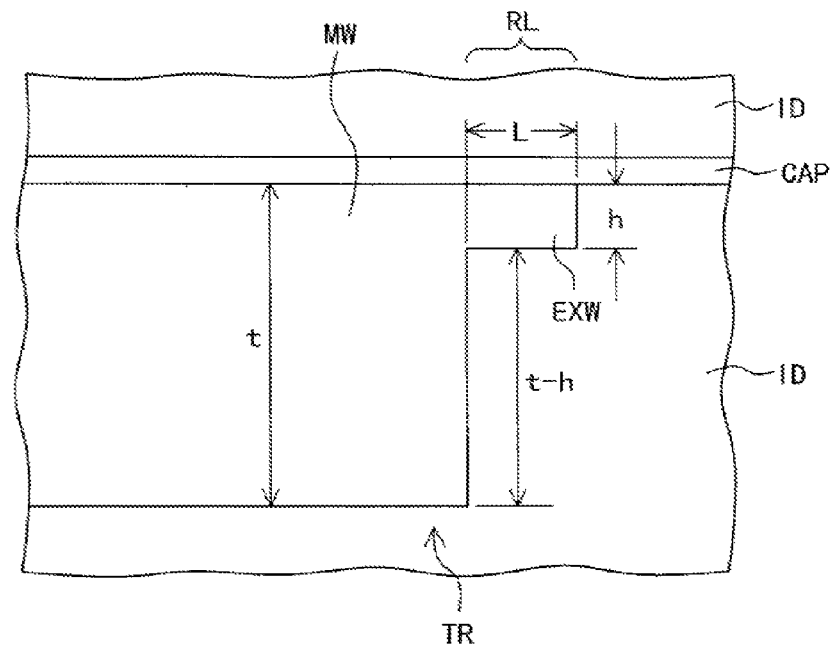
FIG. 3A is a cross-sectional view illustrating a wiring structure.

As illustrated in FIG. 3A, a trench TR with a step shape is formed by etching in an inter-layer insulating film ID. When an entire depth of the trench is t, a side wall is once raised to the height of (t−h), and raised for the remaining height h after extending outward for the width of L. A copper wiring W is buried in the trench TR, and unnecessary portions are removed by CMP, an insulating cap layer CAP which prevents diffusion of copper is deposited, and the inter-layer insulating film ID is further deposited over the insulating cap layer CAP. An extended wiring region EXW with a width L and a height h is formed outside of the main wiring region MW with a total thickness t to form a strain-relaxed region RL.

In the strain-relaxed region RL, the extended wiring region EXW with a thickness of h is disposed over the inter-layer insulating film ID with a thickness of (t−h). The inter-layer insulating film with a thickness of (t−h) is made of the same material as that of the outer inter-layer insulating film and thus a thermal contraction amount (thermal expansion amount) due to a temperature change is the same as that of the outer inter-layer insulating film. The extended wiring region EXW with a thickness h exhibits a height change by a temperature change, for example, a greater rate of thermal contraction by lowering temperature, compared with that of the outer inter-layer insulating film. However, the thickness h is smaller than the entire thickness t, therefore, an absolute value of the height change is small. Depending on the selection of the thickness h, amounts of thermal expansion and contraction may be reduced to desired values. Thus (and, again, without being bound by theory), an amount of a surface subsidence due to lowering temperature in the extended wiring region EXW with a width L is reduced. A main wiring region MW with a total thickness t is continuous to the extended wiring region EXW with a width of L to form a continuous surface. Accordingly, a sharp change in the surface height is not likely to occur. Without being bound by theory, it is expected that a strain exerted on an insulating cap layer CAP becomes smaller when the insulating cap layer CAP is formed by covering a wiring W and an inter-layer insulating film ID.

Figure 3B:
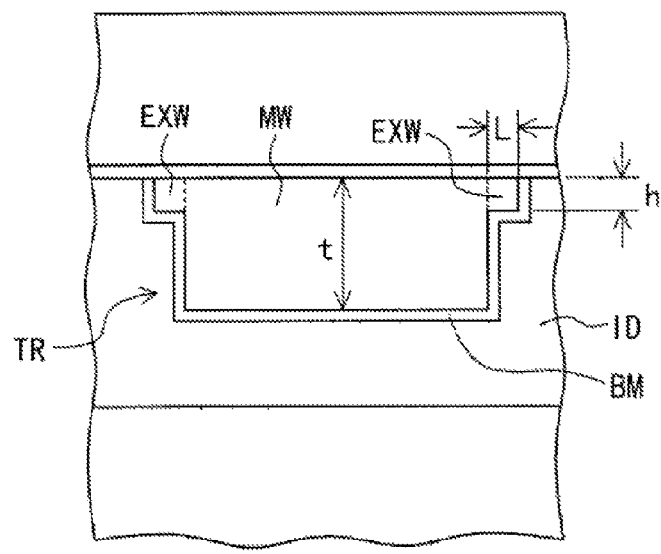
FIG. 3B is a sectional view illustrating a structure of a wiring.

FIG. 3B is a sectional view illustrating a wiring structure based on the above idea. A trench TR that includes extended regions extending outward with step shapes at the upper side of the inter-layer insulating film ID are formed by etching. The total depth of a trench is assumed to be t. The width and the height of the extended region are L and h respectively. A barrier metal film BM, for example, with a thickness of about 20 nm and a copper seed layer, for example, with a thickness of about 50 nm are deposited by sputtering so as to cover the surface of the trench, and a copper film is formed by plating with a depth larger than that of the trench. Unnecessary metal layers over the inter-layer insulating film ID are removed by CMP. Hereunder, the thickness of a barrier metal film BM may be ignored because it is infinitesimal. A main wiring region MW is formed at the main part of a trench with a total depth of t and the extended wiring region EXW is formed at the extended portion of the trench that is continuous from the MW.

For example, the wiring thickness t of the main wiring region MW is assumed to be 3,300 nm. The wiring height of the extended wiring region EXW is assumed to be about 330 nm which is about 10% of the thickness t of the main wiring region MW. The width of EXW is assumed to be about 100 nm in a model M5, while it is assumed to be about 300 nm in a model M6. The above described stress intensity factors are calculated for these models.

Figure 4A:
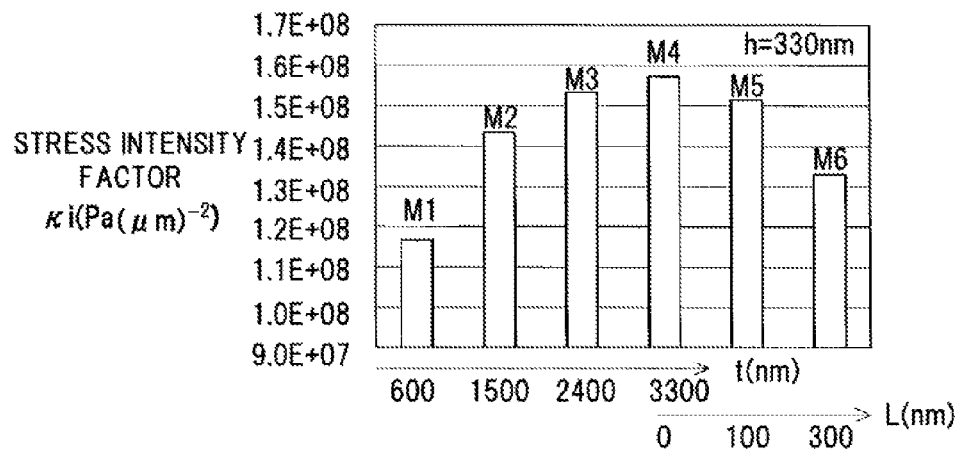
FIGS. 4A to 4C are graphs illustrating calculated stress intensity factors for a thickness of a wiring t, a width of an extended region L, a height of an extended portion h.

FIG. 4A is a graph illustrating stress intensity factors κi for the widths of L of the model M5 and the model M6 in which the width L of the EXW is about 100 nm and 300 nm respectively. The stress intensity factors κi for the models M1 to M4 in which the width L=about 0 are illustrated as well. For models M4 to M6, stress intensity factors κi for the widths L of EXW are about 0 nm (model M4), about 100 nm (model M5), and about 300 nm (model M6) are illustrated in which t=about 3,300 nm and height h=about 330 nm. With an increase of the width L, the stress intensity factor κi decreases. The stress intensity factors κi of M5 in which t=about 3,300 nm and L=about 100 nm is smaller than that of M3 in which t=about 2,400 nm, and L=about 0 nm. The stress intensity factors κi of M6 in which t=about 3,300 nm and L=about 300 nm is smaller than that of M2 in which t=about 1,500 nm, and L=about 0 nm. When M5 and M6 are compared with M4 all of which have the same wiring thickness, t=about 3,300 nm, the decrease in the stress intensity factor κi for the M6 in which L=about 300 nm is three times larger than that of M5 in which L=about 100 nm. Based upon the result of the comparison, the inventor inferred that advantages can be obtained by making the width of the EXW larger than about 100 nm, for example, about 150 nm or more.

The stress intensity factor when a height of the EXW is about 660 nm which is about 20% of the main wiring region t is calculated as well.

Figure 4B:
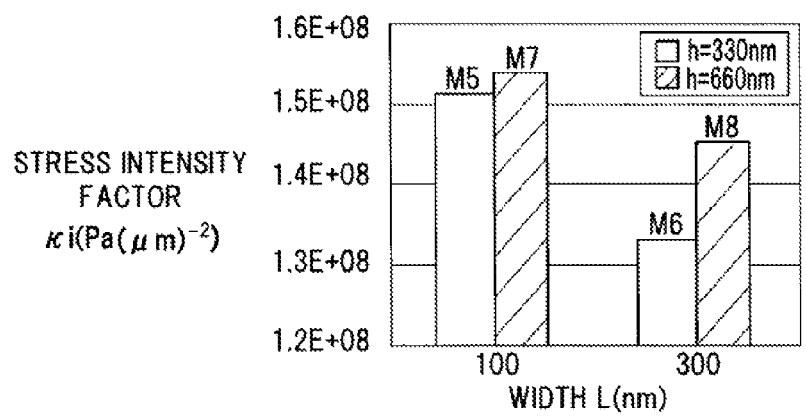

FIG. 4B is a graph illustrating the stress intensity factors κi for models M7 and M8 with the height h of the EXW is about 660 nm and the width L of the EXW is about 100 nm (M7) and about 300 nm (M8) respectively and the stress intensity factors κi for models M5 and M6 with the height h of the EXW is about 330 nm. The graph indicates that increasing the height of the EXW increases the stress intensity factor κi and decreases effect of relaxing strain. In the case that the height of the EXW is about 330 nm, the stress intensity factors κi substantially decreases when the width L is increased from about 100 nm to 300 nm. However, in the case that the height of the EXW is increased to about 660 nm, decrease in the stress intensity factors κi is small even when the width L is increased from about 100 nm to 300 nm. It is expected that further increasing the height of the EXW may further decrease the effect of relaxing strain. The change in stress intensity factors κi when the height h of the EXW is further changed is examined.

Figure 4C:
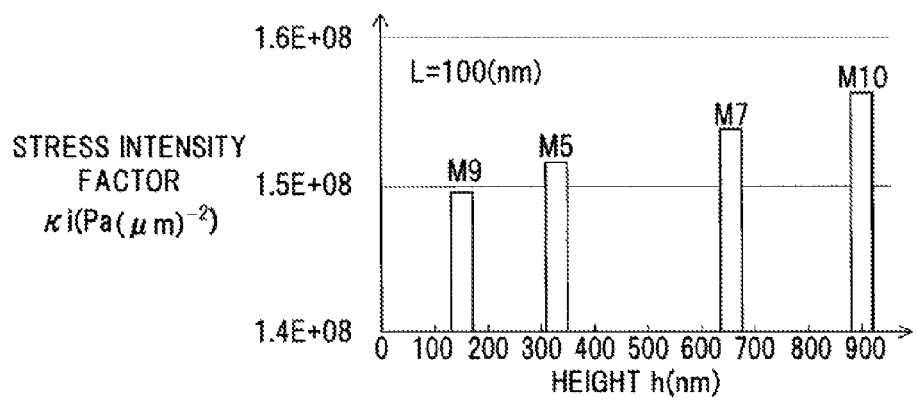

FIG. 4C is a graph illustrating a change in the stress intensity factors κi when the width of EXW L is about 100 nm, the height h is about 150 nm (M9), about 330 nm (M5), about 660 nm (M7), and about 900 nm (M10) respectively. The horizontal axis indicates the height of the EXW h (in nm); while the vertical axis indicates the stress intensity factors. Assuming a straight line that connects the stress intensity factors of the models M5 and M7, the stress intensity factor of the model M10 in which the height h is increased, is higher than the line (linearly approximate), while that of the model M9, in which the height h is decreased, is lower than the line (linearly approximate). Increasing the height h decreases the effect of relaxing strain; whereas decreasing the height h strengthens the effect of relaxing strain.

In some respects it may be preferable that the height of the EXW be shorter than a certain level in order to relax strain. However, decreasing the height of the EXW increases resistance in the EXW. Thus, it may not be preferable in terms of efficient use of the substrate area.

Without being bound by theory, occurrence of a peeling depends on whether the interface provides sufficient adhesion property that may counter the calculated stress intensity factor. In other words, a practical limit depends on processes and materials used. When processes that provide very high adhesion are used, an occurrence of a peeling could be avoided without providing an extended wiring region at the copper wiring height of about 2,400 nm. The copper wiring height of about 2,400 nm without a step structure corresponds to the stress intensity factor κi=1.537E8 Pa/µm² as illustrated in FIGS. 1C and 4A.

Assuming this value as a practical value that a peeling may occur, FIG. 4A indicates (again, without being bound by theory) that a peeling may be avoided by making the EXW extend to about 100 nm or more. When the width L is about 150 nm or more, a stable throughput may be expected even when deviation in a manufacturing process. A wiring with a thickness about 600 nm may not cause a peeling, and FIGS. 4B and 4C indicate that the peeling may be avoided when the height h of EXW is about 660 nm or less.

Hereunder, embodiments based on the above review will be described.

First Embodiment

Figure 5A:
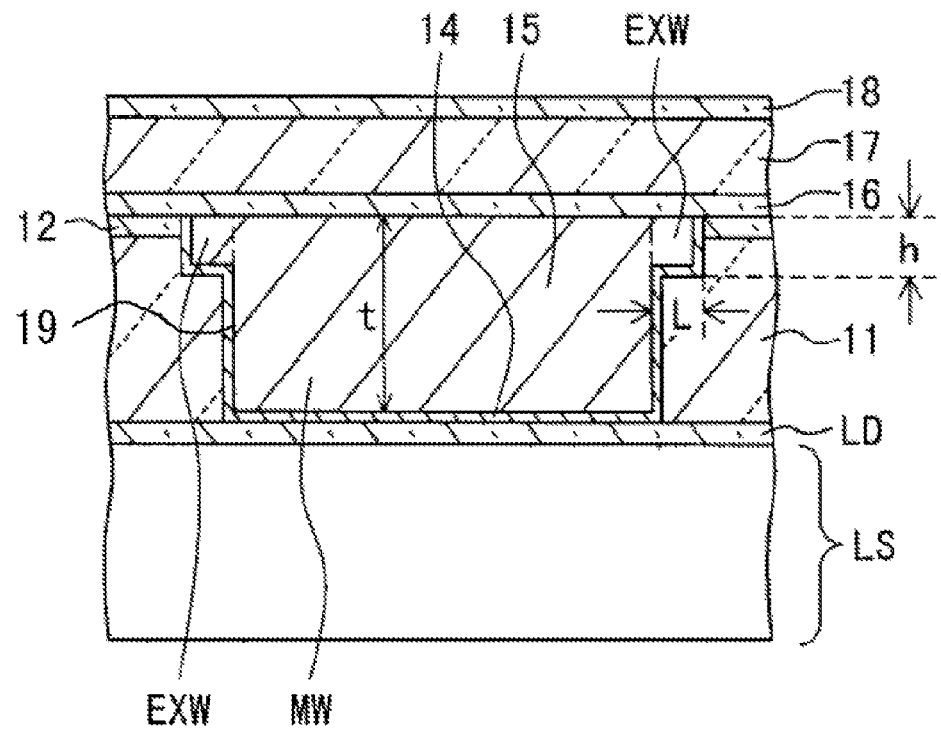
FIG. 5A is a schematic cross-section of a semiconductor device according to a first embodiment.

FIG. 5A illustrates a structure of an upper layer wiring of a semiconductor device according to a first embodiment. Extended wiring regions with one step structures are provided at side walls of a damascene wiring. A SiC film as a base insulating film LD is formed over a lower structure LS that includes a silicon substrate in which a plurality of transistors are formed, and a lower layer wiring. A SiO₂ film 11 and a SiC film 12 are stacked over the base insulating film LD to constitute an inter-layer insulating film. A trench 19 is formed by etching the SiC film 12 and the SiO₂ film 11 to accommodate a wiring structure. The trench 19 includes an extended portion extending outward from the main trench. A barrier metal film 14 and a copper wiring layer 15 are buried in the trench to form a copper wiring. The copper wiring is formed in a main wiring region MW with a thickness t of about 3,300 nm and the outside of the MW continuously, and includes an extended wiring region EXW with a height h of about 330 nm and a width L is about 300 nm. A SiC film 16, a SiO₂ film 17, and a SiN film 18 are stacked so as to cover the copper wiring and the inter-layer insulating film. In a created sample, a width of the main wiring region is about 10 µm and the length of the wiring is about 100 µm.

FIGS. 5B to 5H illustrate an example of a manufacturing process of a semiconductor device illustrated in FIG. 5A.

Figure 5B:
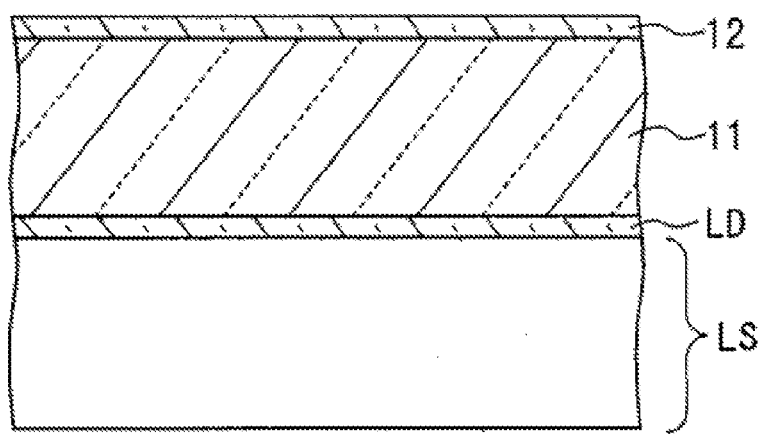
FIGS. 5B to 5H are schematic cross-sections illustrating a manufacturing process of the wiring structure in FIG. 5A.

As illustrated in FIG. 5B, as a base insulating film LD, for example, a SiC film with a thickness of about 50 nm is formed over the lower structure LS. For example, a SiO₂ film 11 with a thickness of about 3,200 nm and a SiC film 12 with a thickness of about 100 nm are formed over the base insulating film LD by Chemical Vapor Deposition (CVD).

Figure 5C:
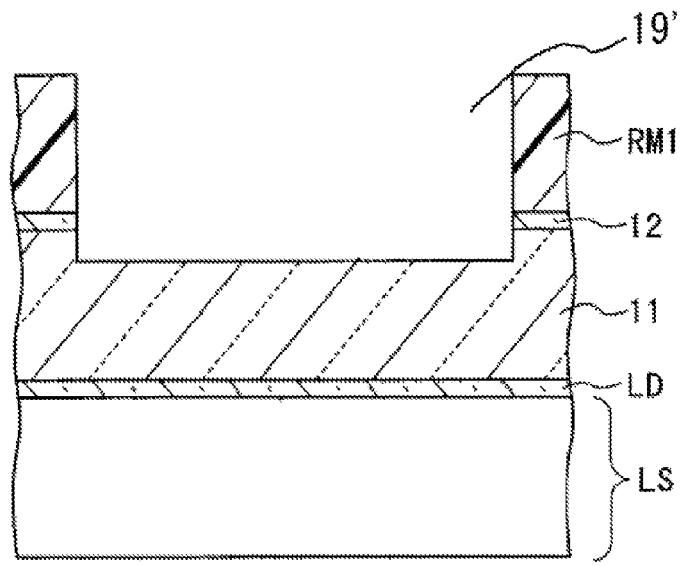

As illustrated in FIG. 5C, a resist mask RM1 with an opening 19' about 10.6 µm in width is formed over the substrate and an entire thickness 100 nm of the SiC film 12 is dry-etched and a depth of about 230 nm of the SiO₂ film 11 is dry-etched by time controlled etching. The depth of a trench to be formed is about 330 nm. After that, the resist mask RM1 is removed.

Figure 5D:
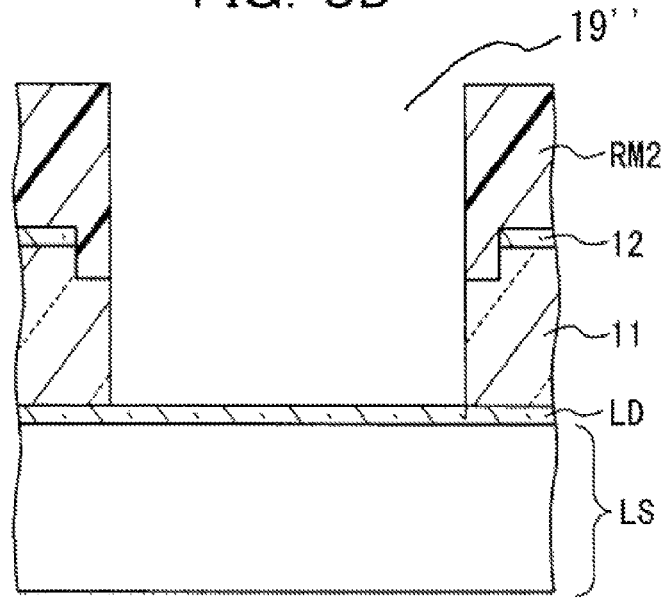

As illustrated in FIG. 5D, the width of the opening 19" in the resist mask RM2 is about 10 µm which is about 300 nm narrower at respective sides as compared to the opening of the resist mask RM1. The resist mask RM2 is an etching mask, and the remaining thickness of the SiO₂ film 11 is dry-etched. After that, the resist mask RM2 is removed. A trench that includes extended portions with a width of about 300 nm and a height of about 330 nm at the both sides of the center part of the opening with a depth of about 3,300 nm and a width of about 10 µm is formed.

Figure 5E:
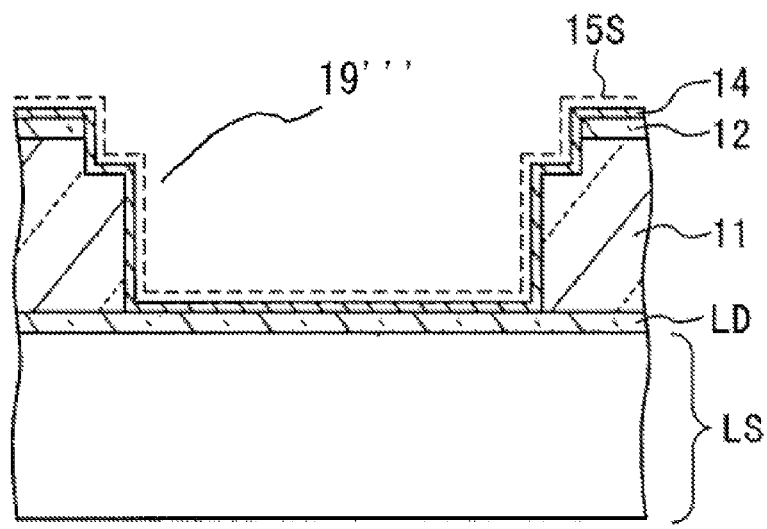

As illustrated in FIG. 5E, a Ta film 14 with a thickness of about 20 nm is formed as a barrier metal film by sputtering in the opening 19''' and on the SiC film 12. Over the Ta film 14, for example, a Cu film 15S with a thickness of about 20 nm is formed as a plating seed layer. For example, the sputtering is applied when temperature of the substrate is room temperature.

Figure 5F:
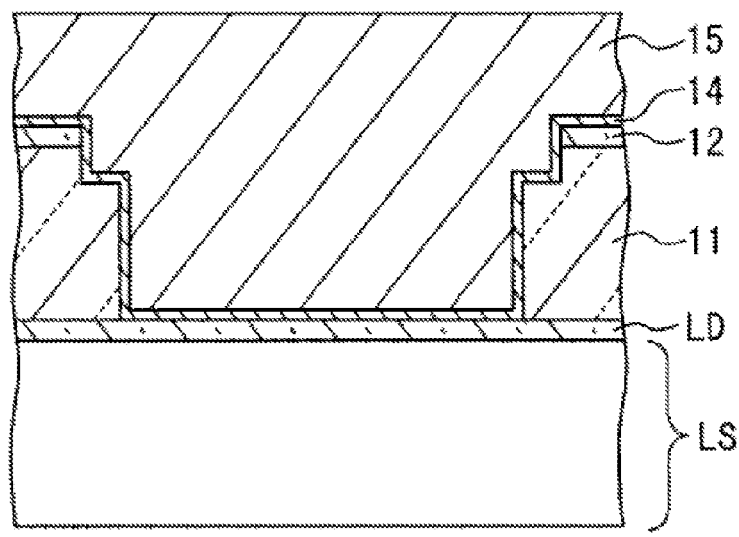

As illustrated in FIG. 5F, a copper layer 15 is obtained by electrolytic-plating of a Cu film over the Cu film 15S. The copper layer 15 is electrolytically plated so as to provide a thickness to bury the trench. For example, heat treating of about 100° C. to about 350° C. is applied to promote grain growth in the Cu film.

Figure 5G:
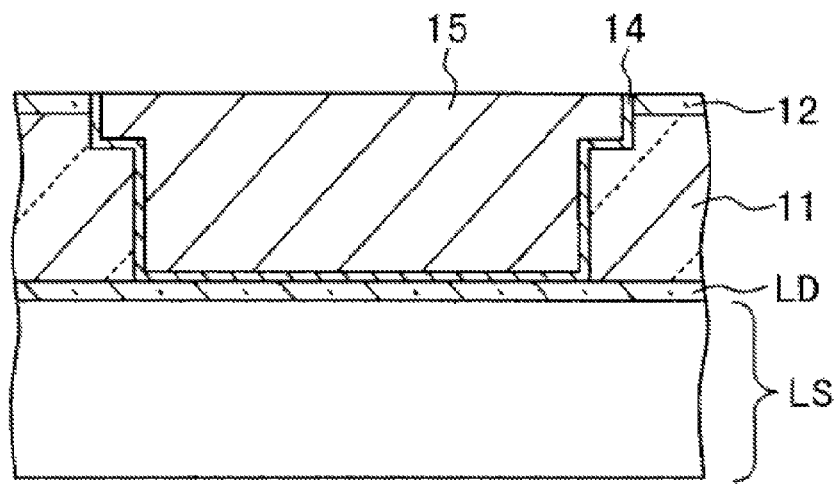

As illustrated in FIG. 5G, the copper layer 15 formed over the surface of the SiC film 12 is removed by CMP. A copper wiring that includes the EXW extending outward from the MW is formed. The MW and the EXW extending outward from the MW constitute a surface that is substantially flush with the surface of the SiC film 12.

Figure 5H:
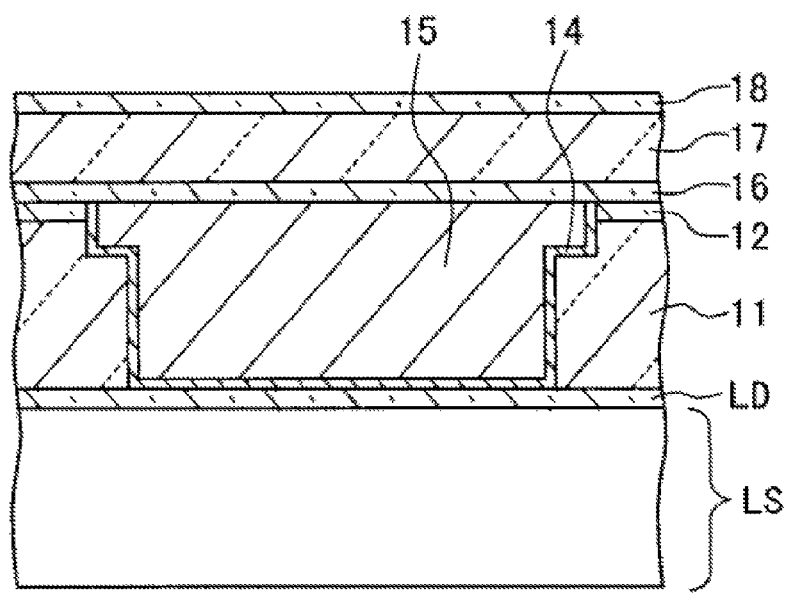

As illustrated in FIG. 5H, for example, a SiC film 16 with a thickness of about 50 nm as an insulating copper diffusion preventing film, a SiO₂ film 17 with a thickness of about 500 nm as an upper insulating film and a SiN film 18 with a thickness of about 50 nm as a passivation film are formed by covering the Cu film 15 and the SiC film 12, for example, by CVD. An opening is formed in the insulating film over the copper wiring by etching using a resist mask and, for example, an Al film is formed to make a pad that becomes a terminal. In this case, for example, a heat treating at about 400° C. for about 30 minutes is applied. In this way, the upper wiring is formed.

According to this embodiment, proof of principle ("POP") samples were prepared. Comparison samples without an EXW were also prepared for comparison. The comparison samples were the same as the POP samples other than the comparison samples did not include the EXW.

A reliability test for a prepared wiring was performed. An electro migration test was performed at temperature about 250° C., and current density of 1 MA/cm$^2$. After performing a test for about 200 hours, no failure occurred in the POP samples of this embodiment, and the comparison samples. However, a resistance of some of the comparison samples changed slightly. Failure analysis was performed for the comparison samples in which the resistance was changed; it was found that a peeling was caused at the interface between the Cu film and SiC film thereover. The resistance of the POP samples did not change and no peeling was found at the interface by examining the POP samples.

According to the above embodiment, the SiO$_2$ film as a main insulating film is formed by CVD; however other vapor-phase method and liquid phase method such as a spin-on deposition (SOD) may be used as well. Although, the SiO$_2$ film is used as a main insulating film, other insulating material may be used as well. For example, SiN and SiCN that provide higher dielectric constant than SiO$_2$ may be used to improve performance as an inductance. The material that is the same as the insulating film of the lower layer wiring, for example, SiOC etc. the conductivity of which is lower than SiO$_2$ may be used. Various changes and replacements may be allowed.

Embodiment 2

In the first embodiment, the step portion of the trench is formed by time controlled etching. In some respects, using an etching stopper structure may allow easier and stable manufacturing of the step structure.

Figure 6A:
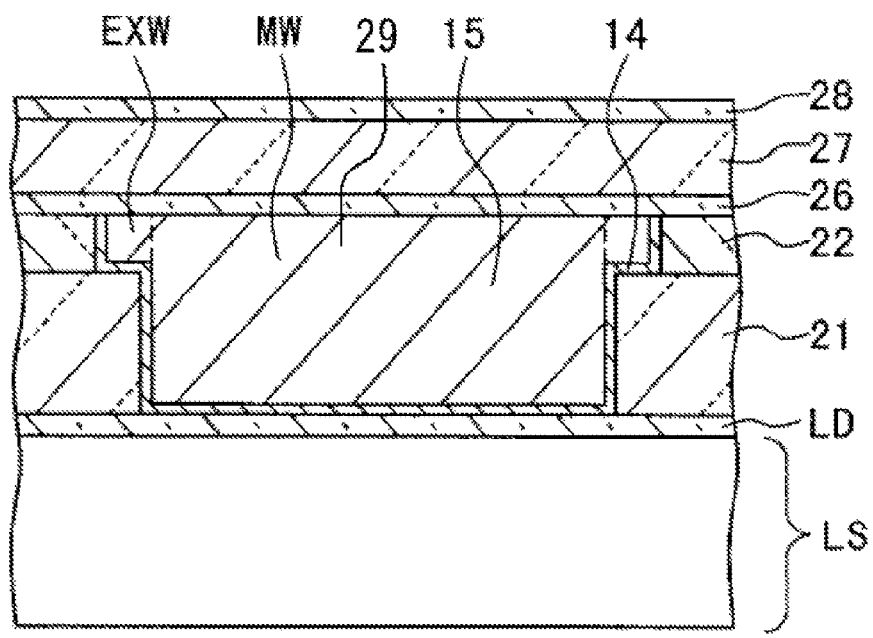
FIG. 6A is a schematic cross-section of a semiconductor device according to a second embodiment.

FIG. 6A illustrates an upper layer wiring of a semiconductor device according to a second embodiment. As in the first embodiment, a SiC film as a base insulating film LD is formed over a lower structure LS that includes a silicon substrate in which a plurality of transistors are formed and a lower layer wiring. A SiO$_2$ film 21 with a thickness of about 3,000 nm and a SiN film 22 to be a hard mask with a thickness of about 330 nm are laminated over the base insulating film LD to form an inter-layer insulating film. A trench (corresponding to item 29 in FIG. 6A) having a step is formed at the interface between the SiN film 22 and the SiO$_2$ film 21. An extended portion of the trench is formed by etching the SiN film 22 and the height of the trench is as high as the depth of the SiN film 22, that is h=about 330 nm. A barrier metal film 14 and a copper wiring layer 15 are buried to form a copper wiring which is the same as the first embodiment. The copper wiring is formed in the main wiring region MW and the outside continuously, and formed in the extended wiring region EXW with a height h of about 330 nm, and a width L is about 300 nm. Respective sides of the EXW are in contact with the SiN film 22. A cap film 26 that is constituted of a SiC film providing a copper diffusion preventing function with a thickness of about 70 nm, a SiO$_2$ film 27 with a thickness of about 500 nm, and a SiN film 28 with a thickness of about 50 nm are laminated so as to cover the copper wiring, and the SiN film 22. As in the first embodiment, an opening may be formed in the insulating film to form an Al terminal.

FIGS. 6B to 6F illustrate a manufacturing process of a semiconductor device illustrated in FIG. 6A.

Figure 6B:
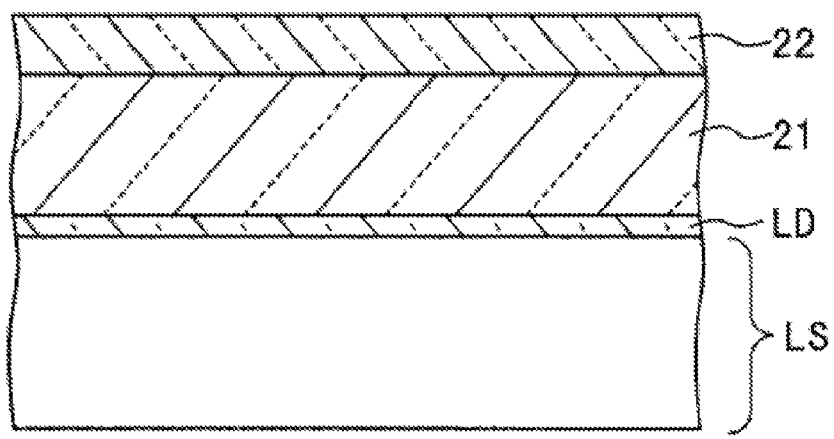
FIGS. 6B to 6F are schematic cross-sections illustrating a manufacturing process of the wiring structure in FIG. 6A.

As illustrated in FIG. 6B, as a base insulating film LD, for example, a SiC film with a thickness of about 50 nm is formed over the lower structure LS. For example, a SiO$_2$ film 21 with a thickness of about 3,000 nm and a SiN film 22 with a thickness of about 330 nm are formed over the base insulating film LD by Chemical Vapor Deposition (CVD). Etching characteristics of the SiO$_2$ film 21 and the SiN film 22 differ, thus the SiO$_2$ film 21 may be an etching stopper when etching the SiN film 22.

Figure 6C:
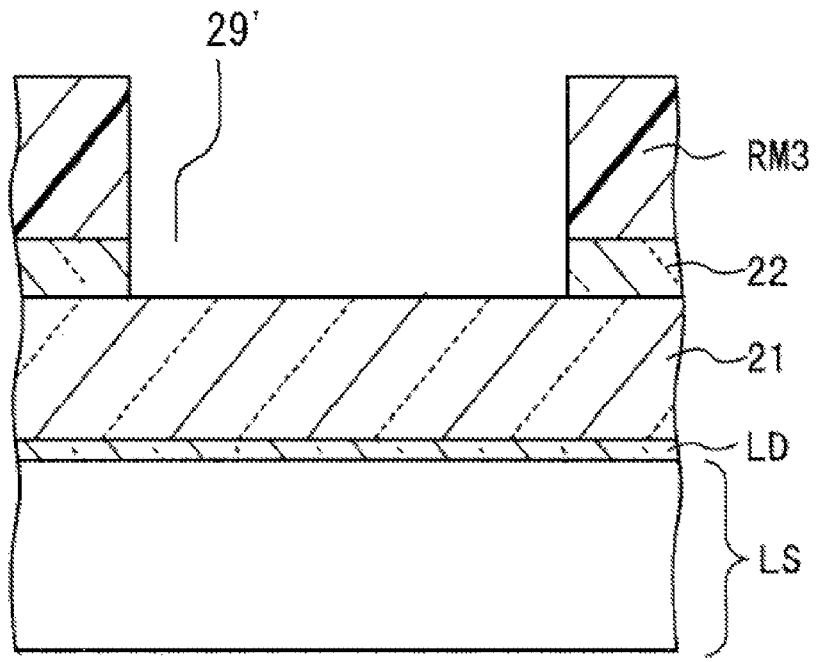

As illustrated in FIG. 6C, a resist mask RM3 with an opening 29' about 10 μm in width is formed over the SiN film 22, and the entire thickness of about 330 nm of the SiN film 22 is etched by wet etching using H$_3$PO$_4$ as etching liquid. The SiO$_2$ film 21 is not etched by H$_3$PO$_4$ and the etching is automatically stopped. The SiN film 22 is continuously etched by wet etching, thus smooth sides may be obtained. After that, the resist mask RM3 is removed.

Figure 6D:
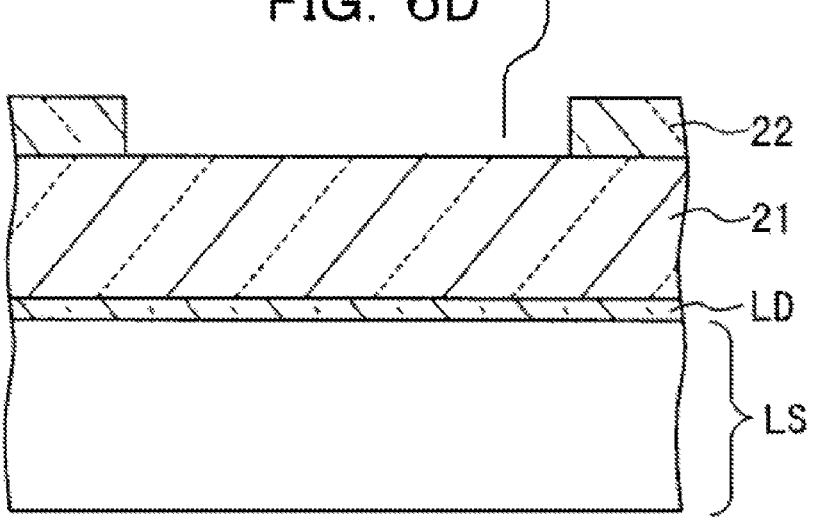

As illustrated in FIG. 6D, the SiO$_2$ film 21 is dry-etched using the etched SiN film 22 as a hard mask, and leaving an opening 29". The etching is the same as the dry etching in FIG. 5D, although a resist mask is not used.

Figure 6E:
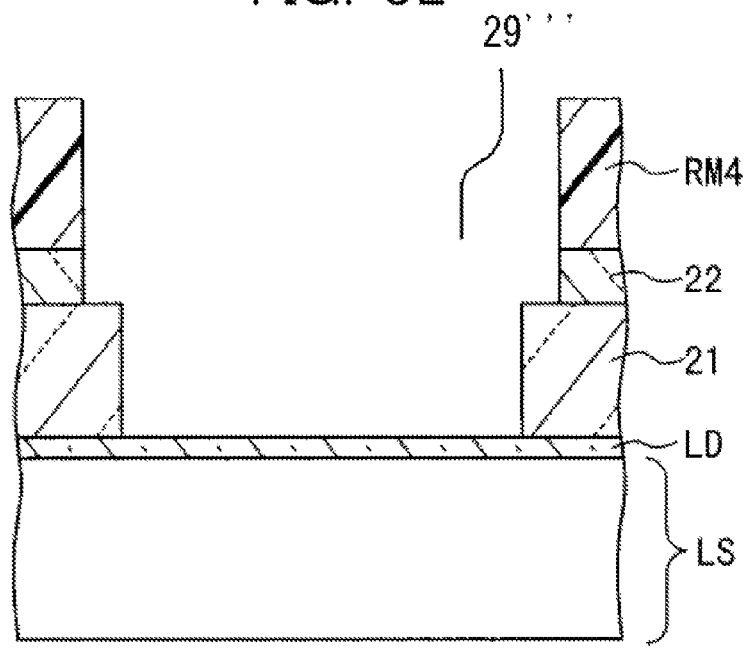

As illustrated in FIG. 6E, a resist mask RM4 with an opening 29''' about 10.6 μm in width, and which is 300 nm wider at respective sides of the opening 29" of the resist mask RM3 in FIG. 6D, is formed over the SiN film 22. The SiN films 22 are exposed in both sides of the opening with a width of about 300 nm each. For example, the SiN film 22 is wet-etched by using H$_3$PO$_4$ as etching liquid. The SiC film LD, and the SiO$_2$ film 21 are not etched by H$_3$PO$_4$. Only the SiN film 22 is etched to form an extended portion of a trench. As in the first embodiment, when interfaces of various layers exist in the intermediate depth of the extended portion, roughness due to the interfaces tend to be formed. A sharp side may be formed without causing asperities because a single layer is wet-etched in this embodiment. After that the resist mask RM4 is removed. The trench, having a depth of 3.3 μm and a width of about 10 μm with a step structure including an extended portion of about 300 nm in width and about 330 nm in height, is formed at both sides of the center of the trench.

Figure 6F:
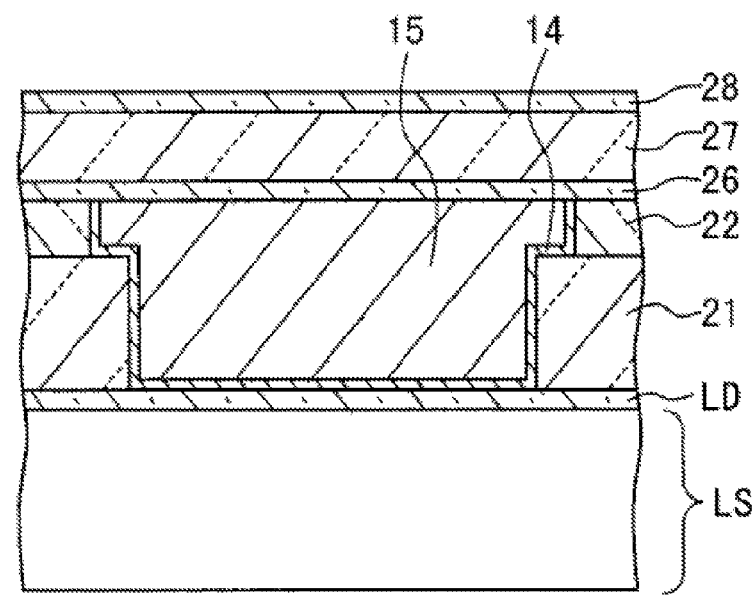

As illustrated in FIG. 6F, for example, a Ta film 14 with a thickness of about 20 nm is formed as a barrier metal film by sputtering as in the first embodiment. After that, a Cu layer 15 is buried in the trench by the same process as the first embodiment. A SiN film 26 with a thickness of about 50 nm that prevents diffusion of copper is deposited by CVD over the SiN layer 22, and over the SiN film 26, a SiO$_2$ film 27 with a thickness of about 500 nm, and a SiN film 28 with a thickness of about 50 nm are deposited by CVD.

According to this embodiment, POP (again, Proof of Principle) samples of this embodiment were prepared. Comparison samples without an EXW were also prepared for comparison. In the POP samples, the width was about 10 μm, and the wiring length was about 100 μm. The comparison samples were the same as the POP samples other than the comparison samples did not include the EXW.

Temperature cycling tests were applied to the samples. The temperature cycles from about −80° C. to about 125° C. were repeated. In the comparison samples, peelings were caused at the interface between the Cu and SiN of about 1% of the comparison samples. In the POP samples, no peeling is caused at the interface between the Cu and SiN.

Third Embodiment

A step structure is not limited to one step and may be a plurality of steps. Any number of steps may be used. Hereunder, two-steps structure will be described as an example.

Figure 7A:
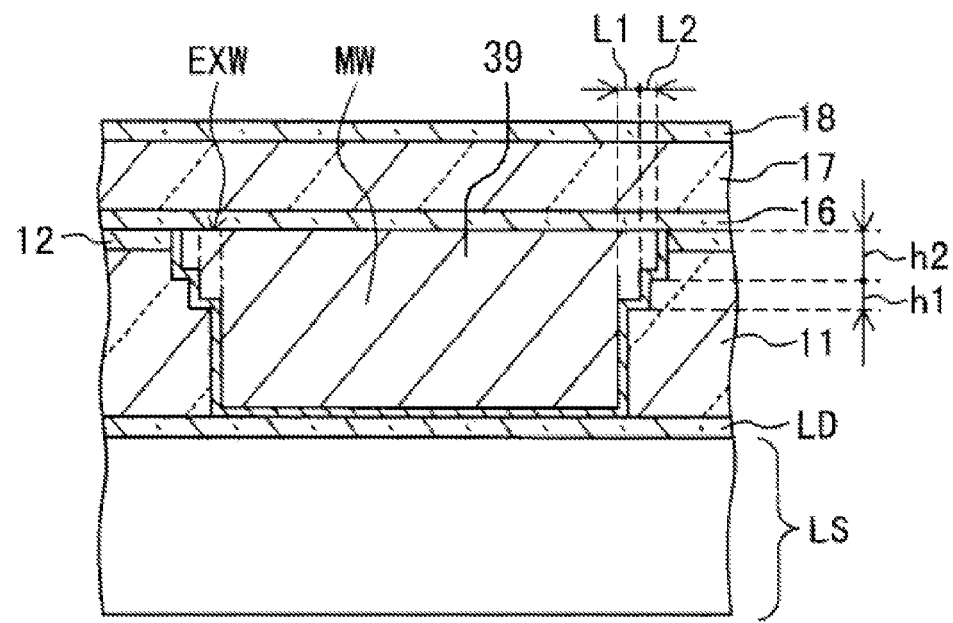
FIG. 7A is a schematic cross-section of a semiconductor device according to a third embodiment.

FIG. 7A illustrates a structure of an upper layer wiring of a semiconductor device according to a third embodiment. Extended wiring regions with two-steps structure are provided at respective side walls of a damascene wiring. As in the first embodiment, a SiC film as a base insulating film LD is formed over the lower structure LS, and over the LD, a SiO$_2$ film 11 with a thickness of about 3,200 nm and a SiC film 12 with a thickness of about 100 nm are laminated to form an inter-layer insulating film. A trench 39 with two-steps structure at the side walls is formed by etching the SiC film 12 and the SiO$_2$ film 11. The trench includes extended portions with a two-step structure extending outside of the main trench. The first step of the extended portion which is continued from the main trench is made up of a width L1=about 150 nm, and a height h1=about 330 nm. The second step which is continued from the first step is made up of a width L2=about 150 nm and a height h2=about 330 nm. The depth from the surface to the first step is about 660 nm.

A barrier metal film 14 and a copper wiring layer 15 are buried in the trench to form a copper wiring as described in the first embodiment. The copper wiring is formed in a main wiring region MW with a thickness of t is about 3,300 nm and the outside of the MW continuously, and includes an extended wiring region EXW with a height h is about 330 nm and a width L is about 150 nm for each step. A SiC film 16 with a thickness of about 50 nm that provides a copper diffusion preventing function, a SiO$_2$ film 17 with a thickness of about 500 nm, and a SiN film 18 with a thickness of about 50 nm are laminated so as to cover the copper wiring and the inter-layer insulating film. The structure of this embodiment corresponds to a structure in which one step structure of the first embodiment is replaced with the two step structure.

FIG. 7B to 7F illustrate an example of a manufacturing process of a semiconductor device illustrated in FIG. 7A.

Figure 7B:
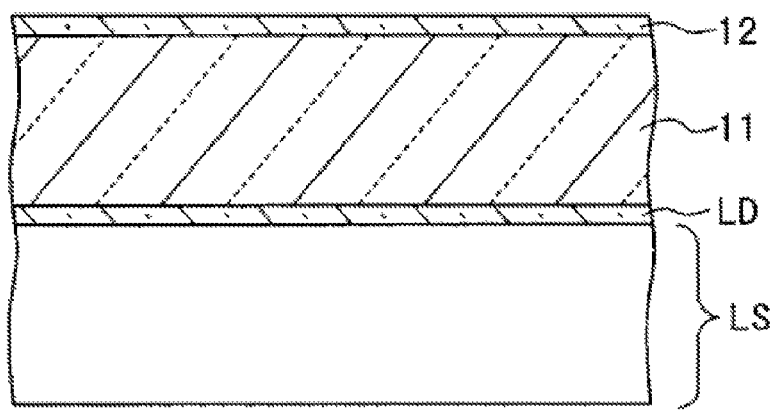
FIGS. 7B to 7F are schematic cross-sections illustrating a manufacturing process of the wiring structure in FIG. 7A.

As illustrated in FIG. 7B, for example, a SiC film with a thickness of about 50 nm as a base insulating film LD is formed over the lower structure LS. For example, a SiO$_2$ film 11 with a thickness of about 3,200 nm and a SiC film 12 with a thickness of about 100 nm are formed over the base insulating film by Chemical Vapor Deposition (CVD).

Figure 7C:
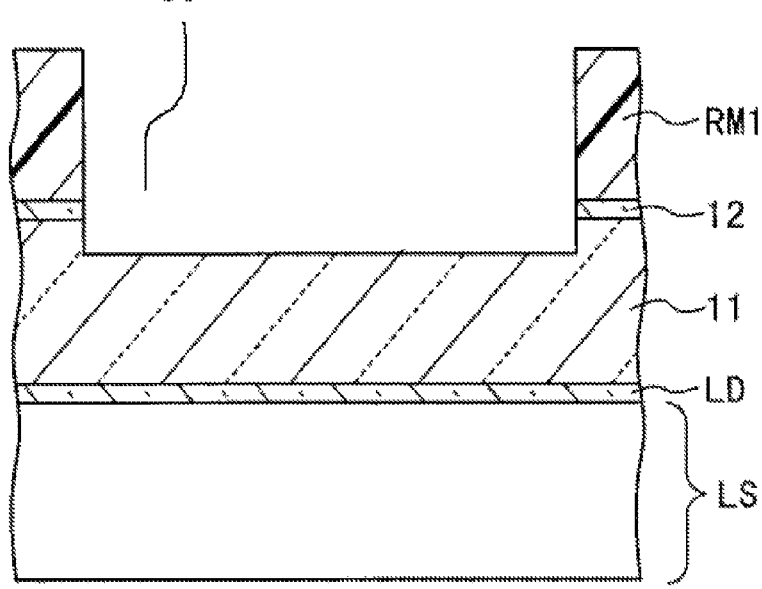

As illustrated in FIG. 7C, a resist mask RM1 with an opening 39' of about 10.6 μm wide is formed over the SiC film 12, an entire thickness of about 100 nm of the SiC film 12 is dry-etched and a depth of about 230 nm of the SiO$_2$ film 11 is dry-etched by time controlled etching. The depth of a trench to be formed is about 330 nm. After that, the resist mask RM1 is removed. The process up to here is the same as that of the first embodiment.

Figure 7D:
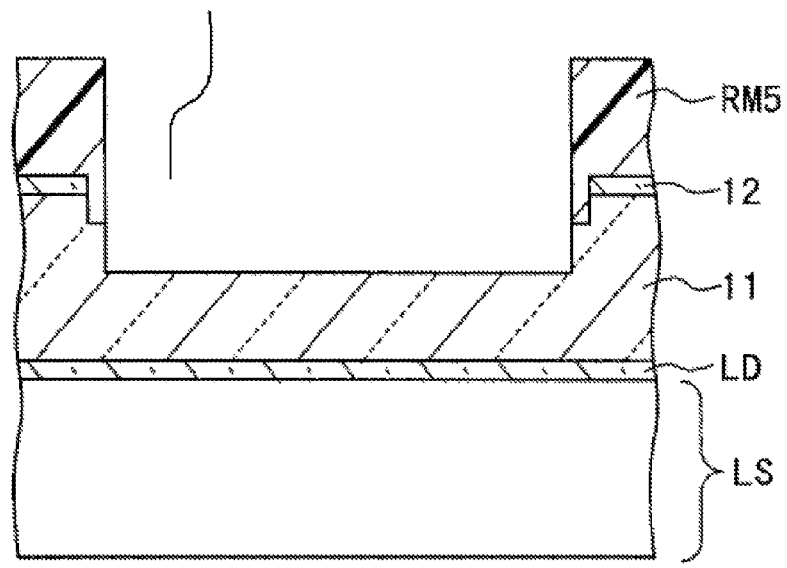

As illustrated in FIG. 7D, a resist mask RM5 with the opening 39" of about 10.3 μm wide which is about 150 nm narrower at respective sides of the opening of the resist mask RM1 is formed over the SiC film 12 and SiO$_2$ film 11. The resist mask RM5 is an etching mask, and the SiO$_2$ film 11 is time control etched for the thickness of about 330 nm. After that, the resist mask RM5 is removed.

Figure 7E:
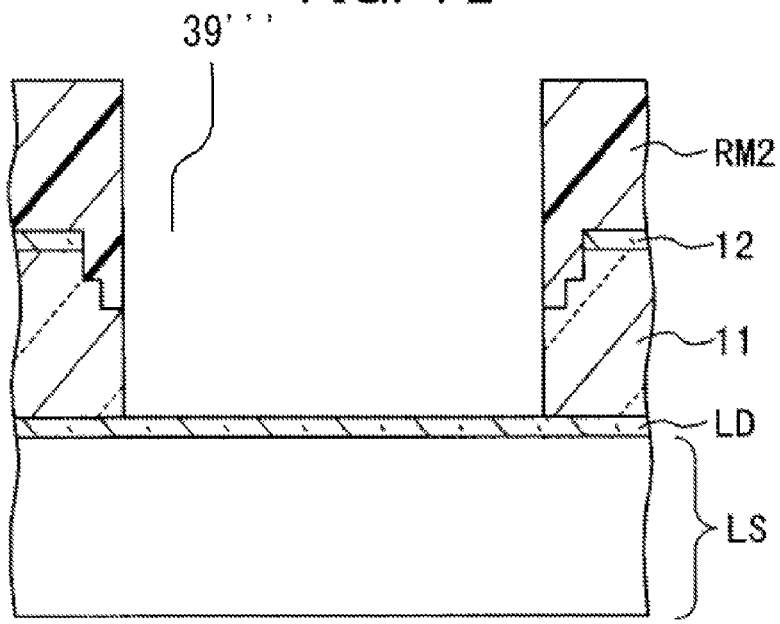

As illustrated in FIG. 7E, a resist mask RM2 with the opening 39''' of about 10 μm wide which is 300 nm narrower at respective sides of the opening of the resist mask RM1 is formed over the SiC film 12 and SiO$_2$ film 11. The resist mask RM2 is an etching mask, and the remaining thickness of the SiO$_2$ film 11 is dry etched. After that, the resist mask RM2 is removed.

A trench 39 that includes extended portions of a two-step structure that is about 150 nm wide and about 330 nm high for each step is formed at the both sides of the center part of the trench with a depth of about 3,300 nm and a width of about 10 μm.

Figure 7F:
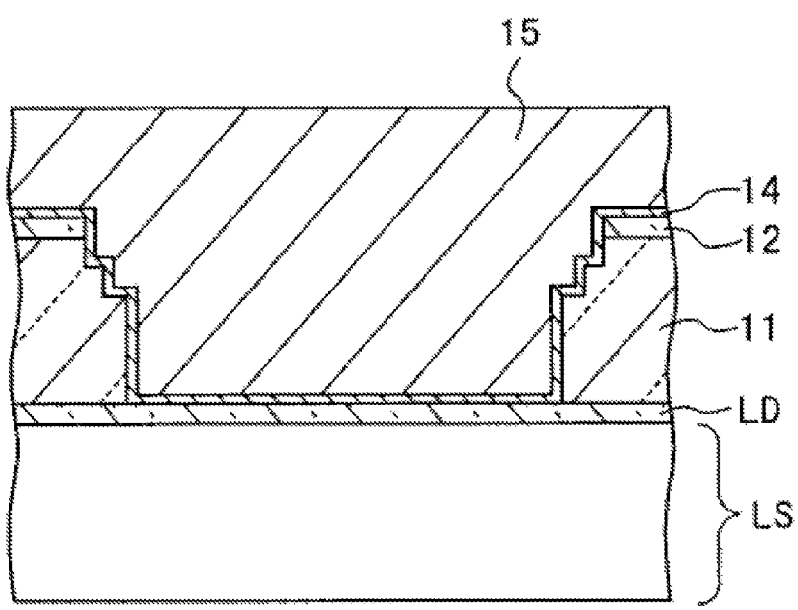

As illustrated in FIG. 7F, a Ta film 14 with a thickness of about 20 nm is formed as a barrier metal film by sputtering, and over the Ta film 14, for example, a Cu film with a thickness of about 50 nm is formed as a plating seed layer. For example, the sputtering is applied when the substrate is at room temperature. A copper layer 15 is obtained by electrolytic-plating of a Cu film over the Cu seed film. The copper layer 15 is electrolytically plated so as to provide a sufficient thickness to bury the trench. For example, heat treating of about 100° C. to about 350° C. is applied to promote grain growth in the Cu film. After that the structure illustrated in FIG. 7A is obtained by the same process as that of the first embodiment.

POP samples of this embodiment and comparison samples without an EXW were also prepared for comparison. The width of main wiring region is about 10 μm, and the wiring length is 100 μm. Electromigration tests were performed for the POP samples and the comparison samples. The test was performed at the temperature about 300° C., and a current density was at 1.5 MA/cm$^2$. Compared with the electro migration test for the POP samples corresponding to the first embodiment, the test condition of the second embodiment is stricter, both in terms of the temperature and the current density. After performing a test for about 168 hours, no failure occurred in the POP samples corresponding to the third embodiment, and the comparison samples. However, a resistance of 10% of the comparison samples changed. Failure analysis was performed for the comparison samples in which the resistance was changed and it was found that a peeling was caused at the interface between the Cu film and SiC film. The resistance of the POP samples of this embodiment did not change and no peeling was found at the interface by examining the POP samples.

Fourth Embodiment

When a conventional wiring without any extended wiring region is formed, the possibility that a peeling is found at the interface between the copper wiring and the copper diffusion preventing film is high at a corner part where the wiring bends at substantially right angle. At the corner part, wiring bends at substantially right angle, and the interface between the side wall of the wiring region and the outside inter-layer insulating film bends at substantially right angle. Accordingly, more complicated stress distribution is generated at the corner part compared with a linear part.

Figure 8A:
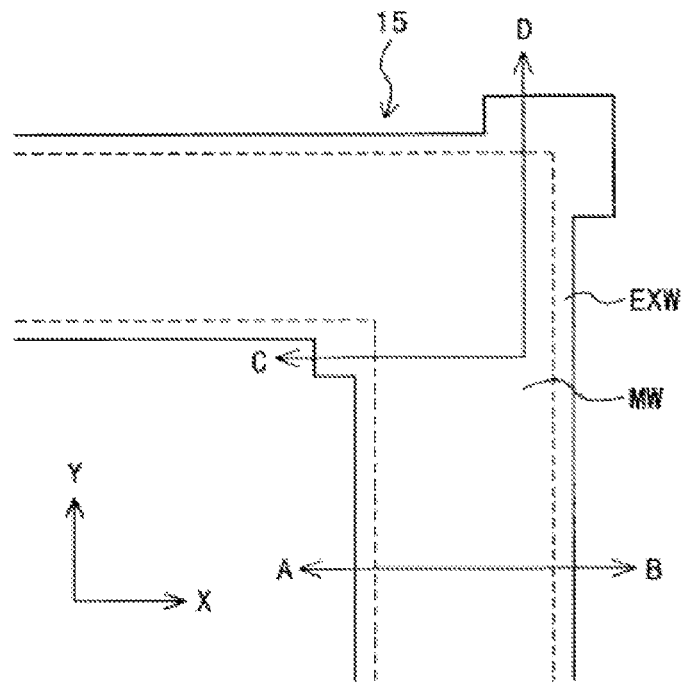
FIG. 8A is a schematic plan view illustrating a wiring pattern according to a fourth embodiment.

FIG. 8A is a plan view illustrating a plan pattern of a wiring according to the fourth embodiment. A linear part along X direction of the wiring 15 and that along Y direction is coupled, and the direction is changed about 90 degree at the bent position. The wiring 15 includes the main wiring region MW and an extended wiring region EXW, and the width of the EXW is wider at the bent part than that of the linear part.

Figure 8B:
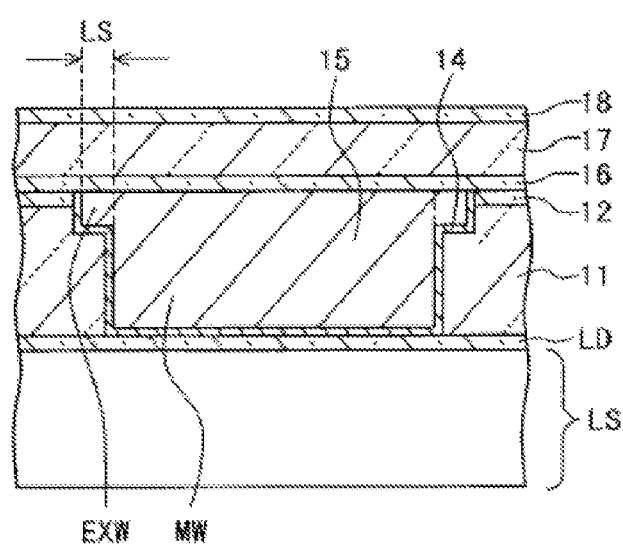
FIGS. 8B and 8C are schematic cross-sections at two points illustrating corresponding wiring structures.

FIG. 8B illustrates the cross-section structure of a linear wiring part along the cutting line A-B in FIG. 8. As in the structure of the cross section in FIG. 5A, the main wiring region MW has a thickness of about 3,300 nm and a width of about 10 μm, while the extended wiring region has a thickness of about 330 nm and a width LS of about 300 nm.

Figure 8C:
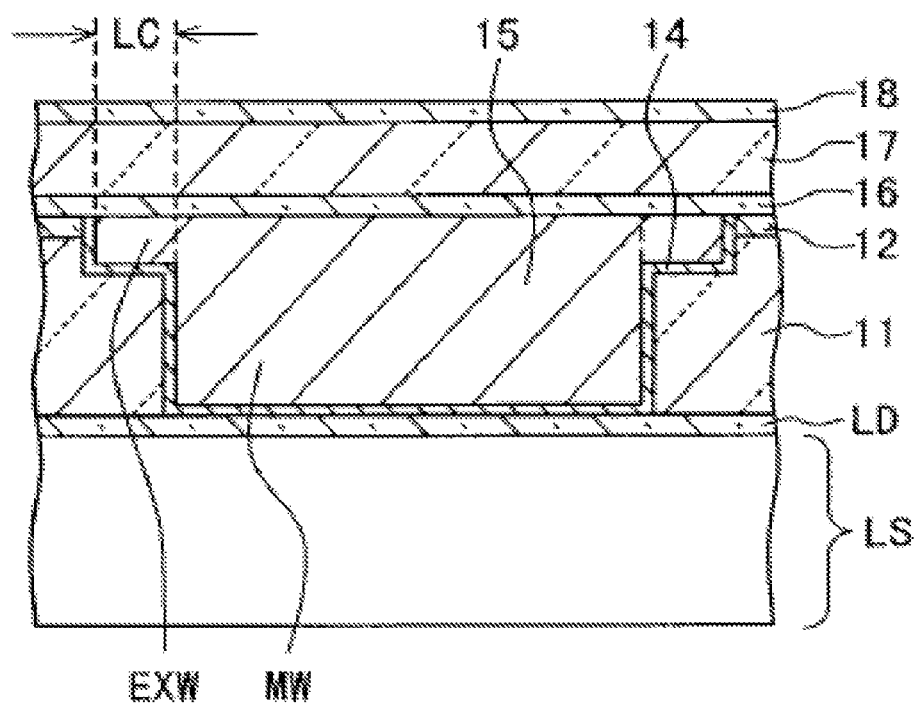

FIG. 8C illustrates the cross section structure of the bent part of the wiring (about 90 degree) along the cutting line C-D in FIG. 8A. Characteristics of the main wiring region MW are the same as that of the linear part. The thickness of the EXW of the bent part is 330 nm which is the same as that of the linear part, whereas the width LC of the bent part are extended to 600 nm in both X direction and Y direction. The width LC of EXW at the bent part is extended to about two times of the width LS of the EXW of the linear part. By extending the width of the bent part may reduce a tendency to cause peeling at the bent part.

POP samples of this embodiment and samples for comparison were prepared, and temperature cycle tests were performed. The wiring shapes in both samples were made up of a repetition of a pattern in which two linear parts were coupled at about 90 degrees. The temperature cycle from about −80 to about 125° C. was repeated. In the comparison samples, peelings were caused at the interface between the Cu and SiC of about 1% of the comparison samples.

In this embodiment, a basic shape of the enlarged extended wiring region at the bent part is a generally rectangular for the convenience of creating a mask. However, the shapes of the bent part and the enlarged extended region are not limited to these.

Figure 9A:
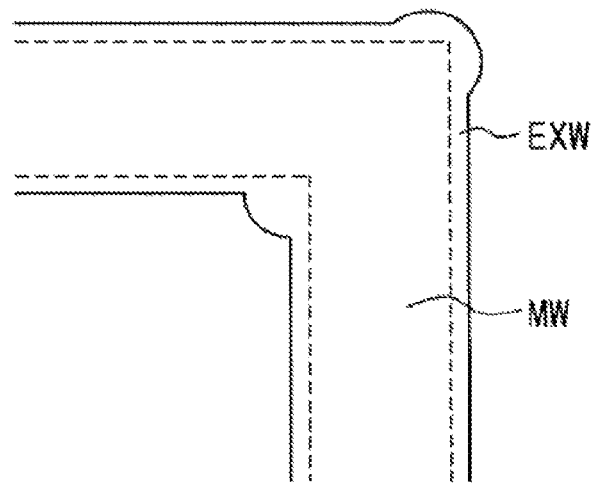
FIGS. 9A to 9E are schematic plan views illustrating modification examples of a wiring pattern of the fourth embodiment.
Figure 9B:
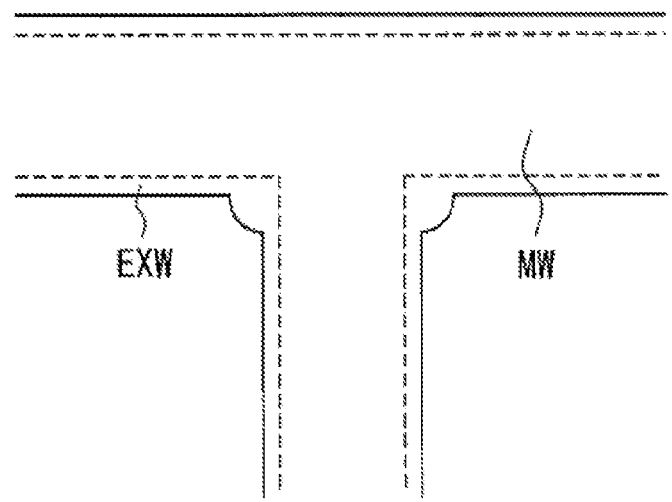
Figure 9C:
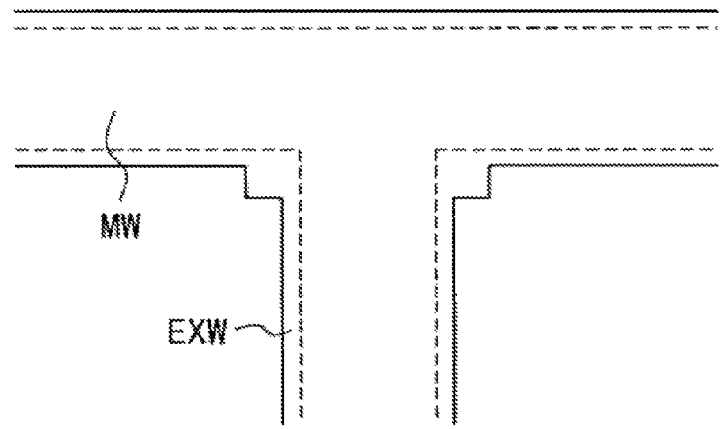
Figure 9D:
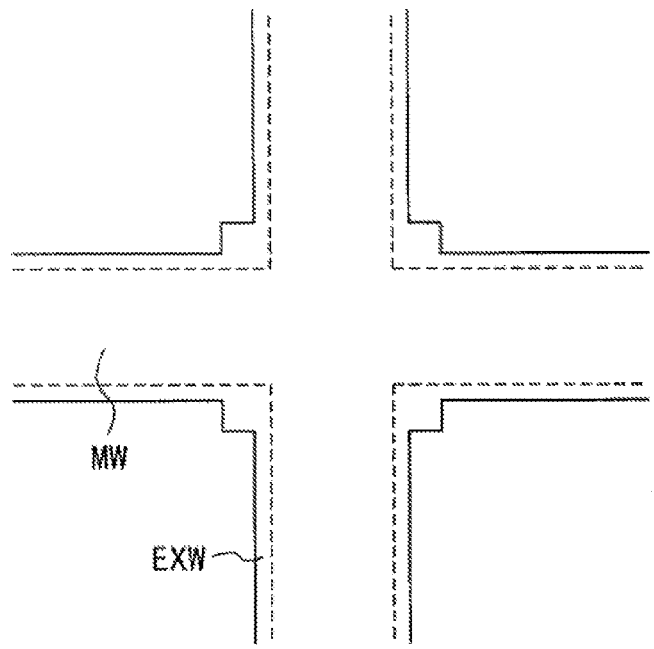
Figure 9E:
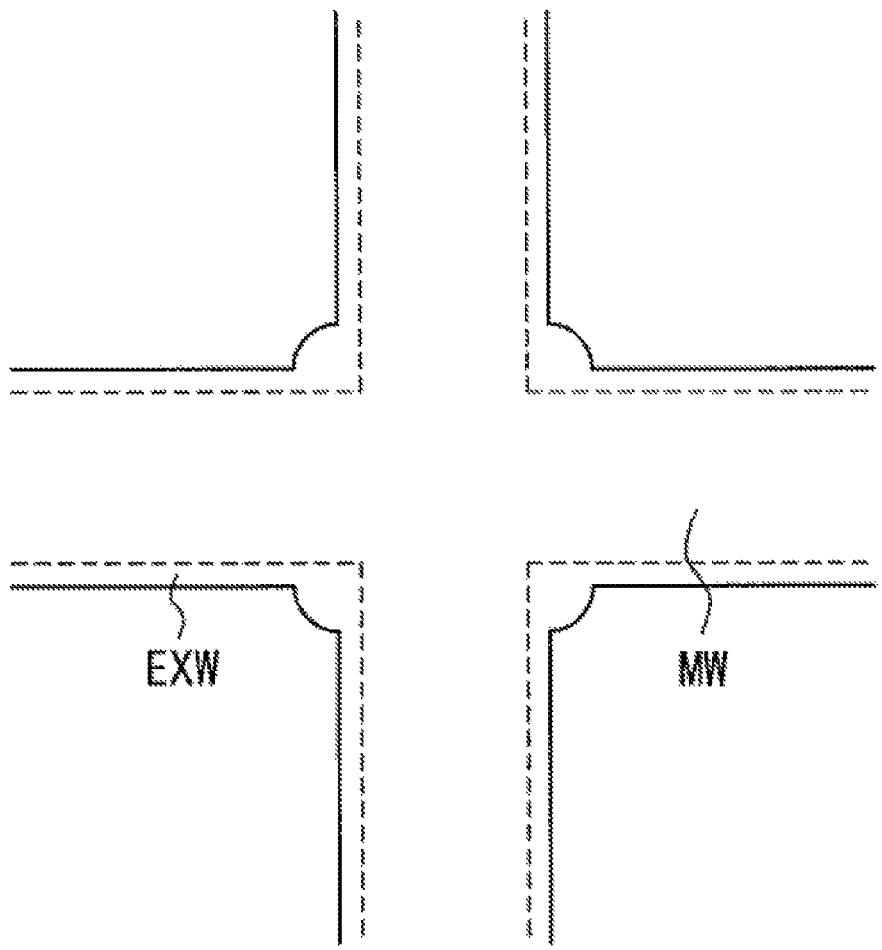

FIG. 9A illustrates a case in which the shape of the EXW enlarged at the bent part is a generally arcuate, e.g., circular. FIGS. 9B and 9C illustrate structures in which wirings are coupled in T shape and a width of the coupled parts of the extended wiring region EXW along the different directions are enlarged to generally arcuate and generally rectangular shapes respectively. FIGS. 9D and 9E illustrate structures in which wirings are intersected and a width of coupled (intersecting) part of the extended wiring region EXW along the different directions are enlarged to a generally arcuate and generally rectangular shapes respectively.

In order to form an inductor, i.e., to form an inductor-configuration, a long wiring length may be required, and a loop shape (or a spiral shape) etc. may be used to accommodate the inductor in a given area.

Figure 10A:
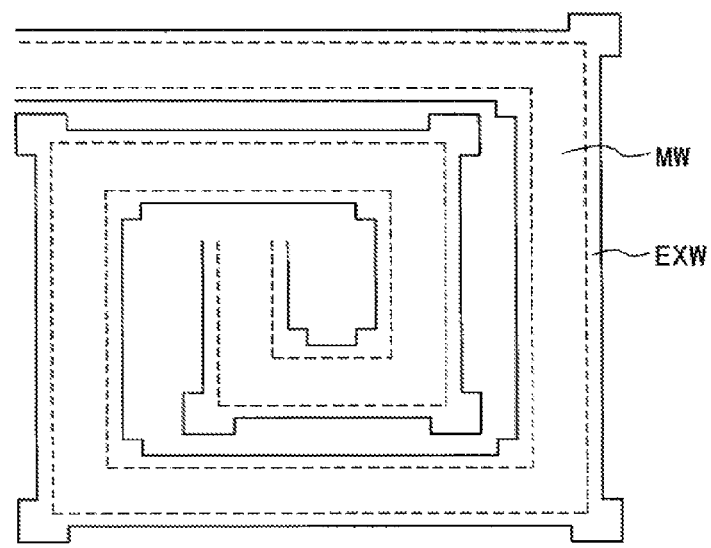
FIGS. 10A and 10B are schematic plan views illustrating a wiring pattern of further modification examples of the fourth embodiment.
Figure 10B:
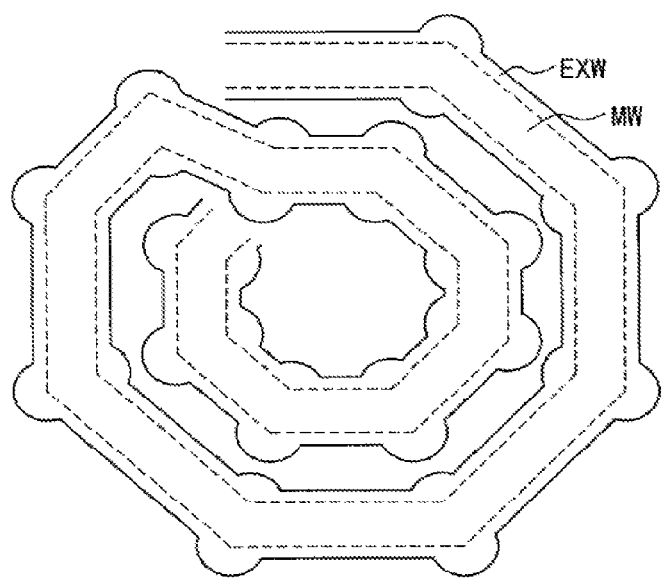

FIGS. 10A and 10B illustrate examples of shapes of inductor wirings.

FIG. 10A illustrates a structure in which linear wirings are coupled at an angle of about 90 degree to form a generally rectangular (square) loop shape. As in the fourth embodiment, a width of the EXW at a coupled part is enlarged to a rectangular shape. When wirings are arranged in a triangular shape, an effect to suppress a peeling may be achieved by providing EXW regions at coupled parts. Enlarging a width of the EXW at a coupled part is effective in suppressing a peeling when a polygonal shape wiring is formed.

FIG. 10B illustrates a structure in which linear wirings are coupled at an obtuse angle to form an octagonal loop wiring. The widths of EXW at coupled parts are enlarged to generally arcuate shapes. The more obtuse in angle the coupled part becomes, the more linear it becomes, thus it is expected that a peeling is less likely to occur.

A higher capacity of an inductor may be achieved not only by thickening a wiring, but also by increasing dielectric constant of insulating films around the wiring. For example, instead of silicon dioxide, using silicon nitride etc. with higher dielectric constant may be considered.

Figure 11A:
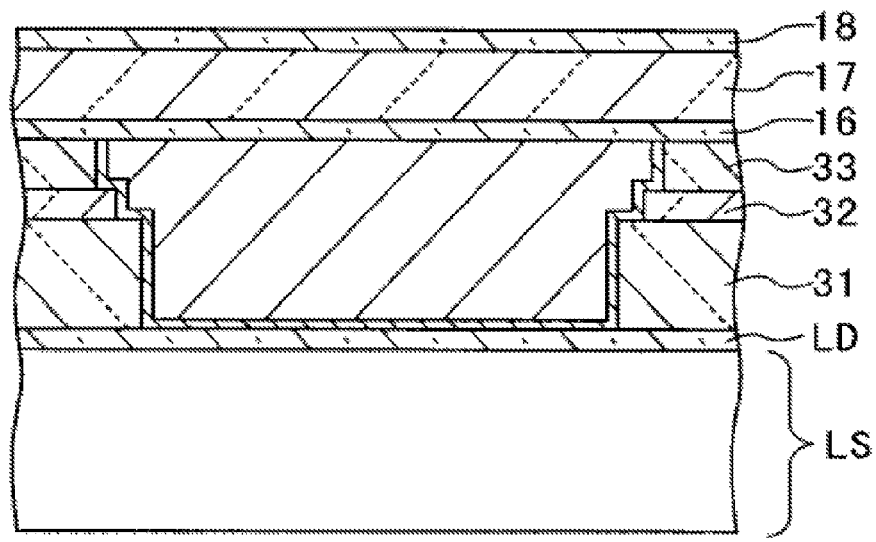
FIGS. 11A and 11B are schematic cross-sections illustrating modification examples of an inductor.

FIG. 11A illustrates a structure of an inter-layer insulating film in which, for example, a SiN film 31, SiO$_2$ film 32, a hard mask film 33 such as SiN are laminated. As in the second embodiment, by using material with different etching characteristics as an etching stopper, steps are constructed at the interface of the different materials to form an extended wiring structure with two steps as in the third embodiment.

Figure 11B:
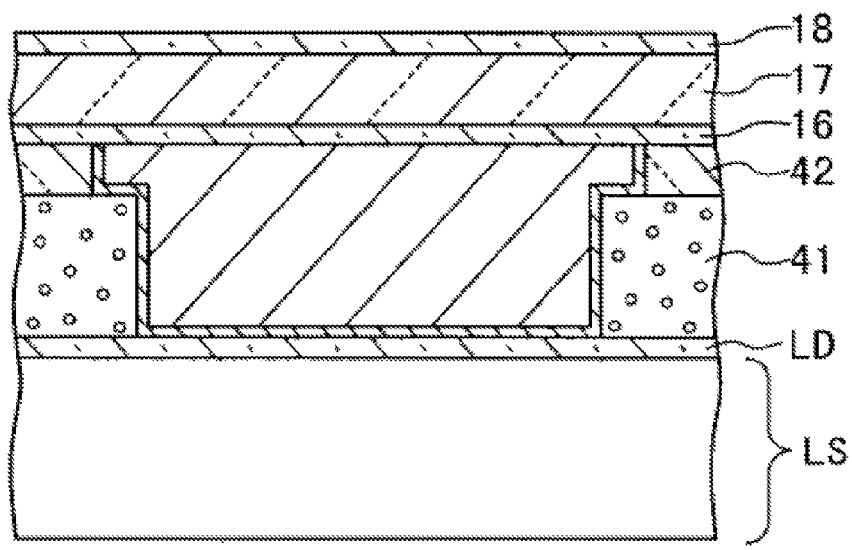

In FIG. 11B, a high dielectric insulating film 41 that includes metallic nanodots in which dielectric constant E is about 10 to 12 is formed over a base insulating film LD that covers a lower structure LS. A hard mask 42 such as SiN or SiC may be formed over the high dielectric insulating film 41 to form an inter-layer insulating film. An etching stopper function as in the second embodiment may be achieved.

Fifth Embodiment

Wiring materials are not limited to copper, and Al and Al alloy may be used. Compared with insulating materials, a metal such as Al exhibits a significant difference in coefficient of thermal expansion. When a thick wiring is surrounded by insulating films, stress based on a difference in coefficient of thermal expansion is applied, and this may cause a peeling. It is expected that providing an extended wiring region outside of the main wiring region reduces strain due to difference in coefficient of thermal expansion.

Figure 12A:
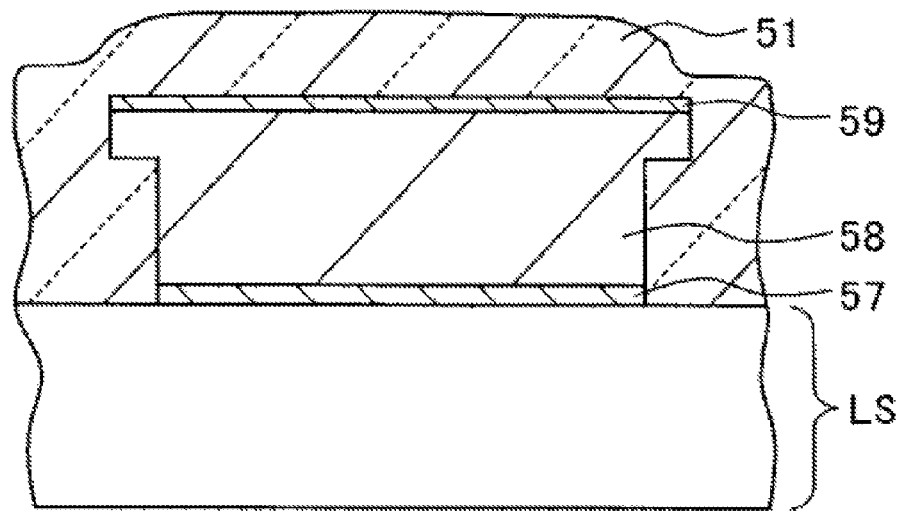
FIG. 12A is a schematic cross section of a semiconductor device according to a fifth embodiment.

FIG. 12A illustrates a structure of an Al wiring. An Al wiring is formed by laminating, for example, a TiN barrier metal film 57 with a thickness of about 50 nm, an Al film 58 with a thickness of about 3,300 nm, and a TiN barrier metal film 59 with a thickness of about 50 nm over the lower structure LS that includes a silicon substrate in which a plurality of transistors are formed and lower wirings. The cross-sectional shape of the Al wiring includes a rectangular main wiring region MW and an extended wiring region EXW extending outward continuously from the upper part of the MW. The width of EXW is, for example, about 300 nm, and the height is, for example, about 330 nm. An insulating film 51 such as SiO$_2$ is formed so as to surround the Al wiring.

FIGS. 12B to 12G illustrate an example of a manufacturing process of the semiconductor device illustrated in FIG. 12A.

Figure 12B:
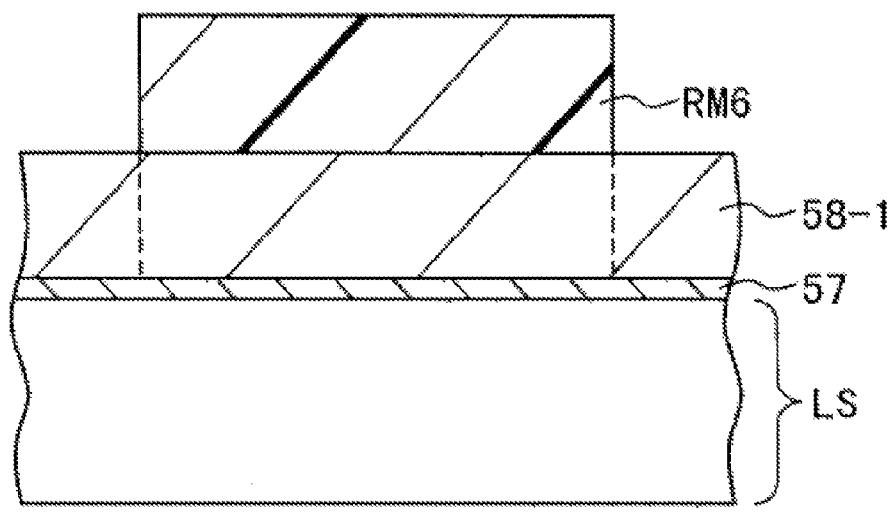
FIGS. 12B to 12G are schematic cross-sections illustrating a manufacturing process of the wiring structure in FIG. 12A, and FIG. 12 H is a schematic cross section of a sample for comparison.

As illustrated in FIG. 12B, for example, a TiN barrier film 57 with a thickness of about 50 nm, and an Al film 58-1 are formed by sputtering over the lower structure LS. Over the Al film 58-1, a resist mask RM6 that includes a plan shape of the main wiring region with a width of about 10 μm is formed. Using the resist mask RM6 as an etching mask, the Al film 58-1 and the TiN barrier film 57 are patterned by dry etching etc. Then, the resist mask RM6 is removed.

Figure 12C:
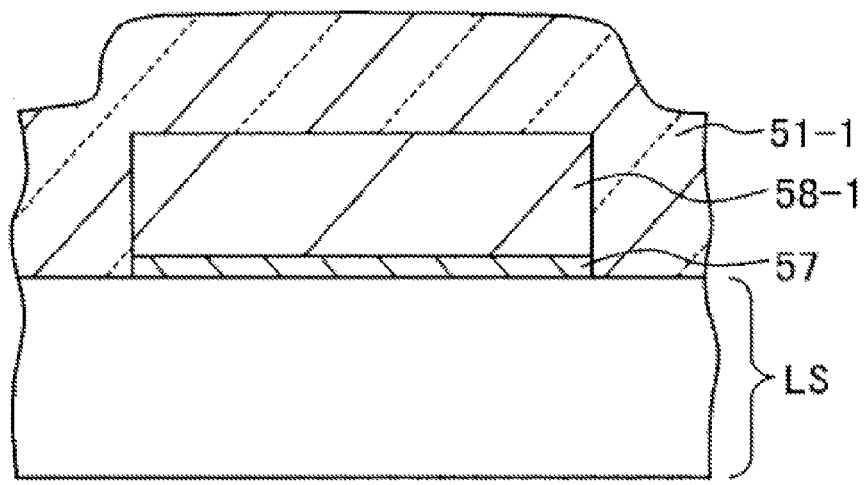

As illustrated in FIG. 12C, a SiO$_2$ film 51-1 is deposited, for example, by plasma CVD etc. over the whole substrate to cover the patterned Al film 58-1 and TiN film 57.

Figure 12D:
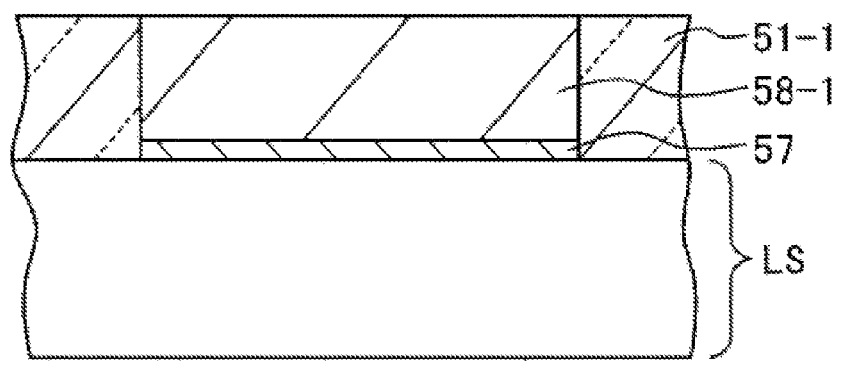

As illustrated in FIG. 12D, the SiO$_2$ film 51-1 is polished by CMP to expose and planarize the surface of the Al film 58-1.

Figure 12E:
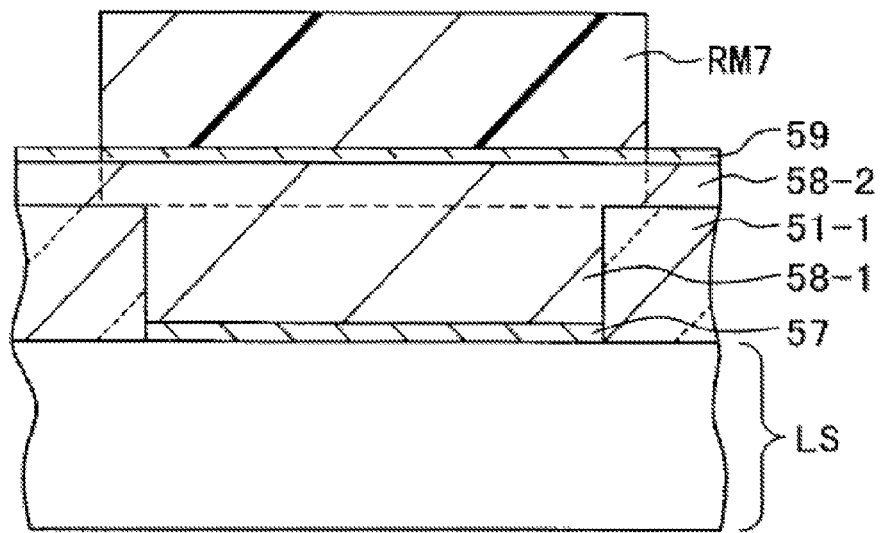

As illustrated in FIG. 12E, an Al film 58-2 with a thickness of about 330 nm and a TiN barrier film 59 with a thickness of about 50 nm are deposited over the substrate by sputtering. A resist mask RM7 that includes a contour of an extended wiring region with a width of about 10.6 μm is formed over the TiN barrier film 59. Using the resist mask RM7 as an etching mask, the TiN barrier film 59 and the Al film 58-2 are patterned by dry etching etc. Then, the resist mask RM7 is removed.

Figure 12F:
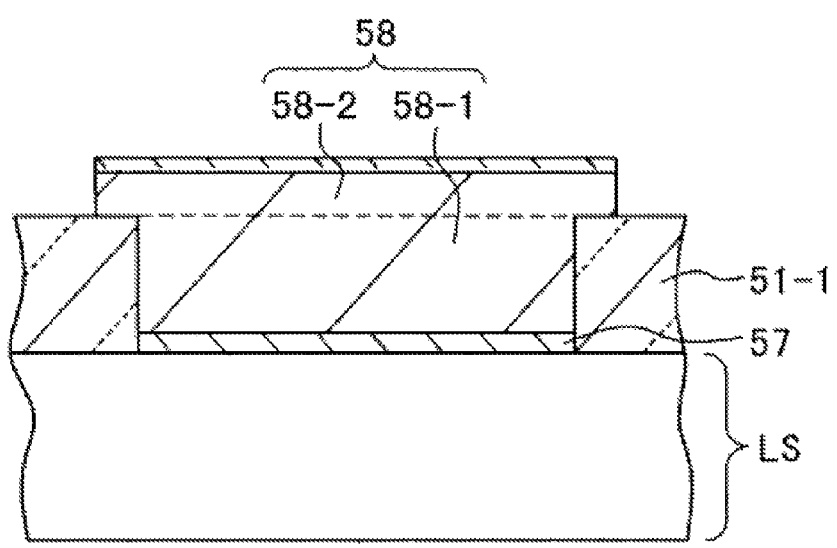

As illustrated in FIG. 12F, an Al wiring that includes an extended region at the upper side is formed. The extended wiring region is formed, for example, by a TiN barrier film 59 and an Al film 58-2. In the main wiring region, the lower Al film 58-1 and an upper Al film 58-2 form an Al film 58, and a TiN barrier film 57 under the Al film 58 and a TiN barrier film 59 over the Al film 58 are laminated respectively.

Figure 12G:
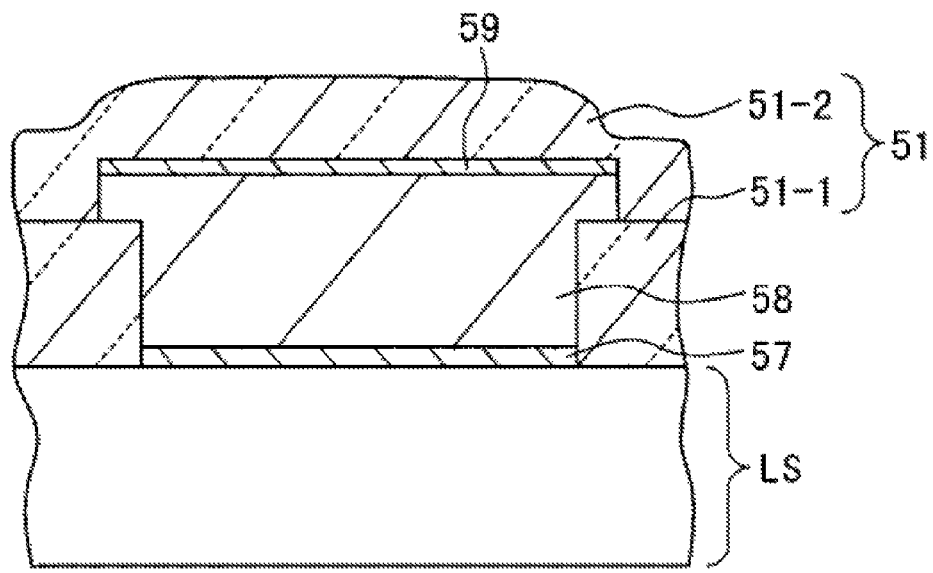

As illustrated in FIG. 12G, a SiO$_2$ film 51-2 is deposited, for example, by plasma CVD so as to cover the patterned TiN barrier film 57 and the Al film 58-1. A SiO$_2$ film 51 includes a lower SiO$_2$ film 51-1 and an upper SiO$_2$ film 51-2.

POP samples of this embodiment and samples for comparison without an extended wiring region were prepared. Temperature cycling tests were applied to the samples.

Figure 12H:
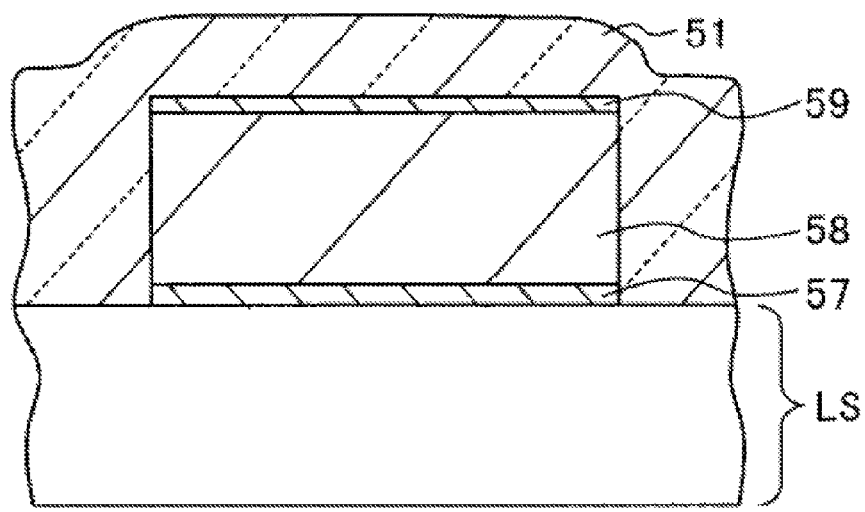

FIG. 12H is a cross-sectional view illustrating a structure of a sample for comparison.

The temperature cycles from about −80° C. to about 125° C. were repeated. In the comparison samples, peelings were caused at sides of 0.1% of the comparison samples. In the POP samples, no peeling was caused on the upper surface and sides without barrier metals.

Figure 13:
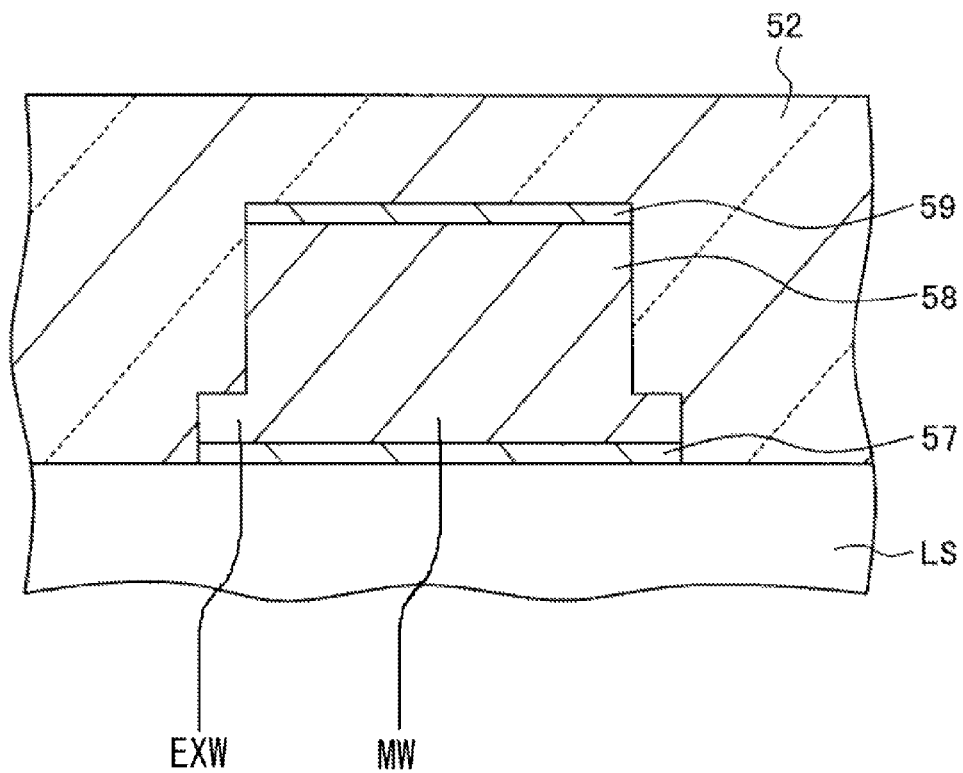
FIG. 13 is a schematic cross section of a structure of a modification example of the fifth embodiment.

FIG. 13 illustrates other structure of the Al wiring. The Al wiring is formed over the lower structure LS, for example, by laminating a TiN barrier metal layer 57 with a thickness of about 50 nm, an Al film 58 with a thickness of about 3.3 µm, and a TiN barrier metal film with a thickness of about 50 nm. The cross-sectional shape of the Al wiring includes a rectangular main wiring region MW and an extended wiring region EXW extending outward continuously from the bottom of the MW. The EXW is, for example, about 300 nm wide, and about 330 nm height. An insulating film 52 such as $SiO_2$ is formed to surround the Al wiring. In this structure, a TiN barrier film 57, an Al film 58, and a TiN barrier film 59 are formed, and etching from the upper part allows defining the contour of the main wiring region and forming a resist mask with an extended width to define the shape of the extended region. Thus, dividing filming processes is not required.

Figure 14:
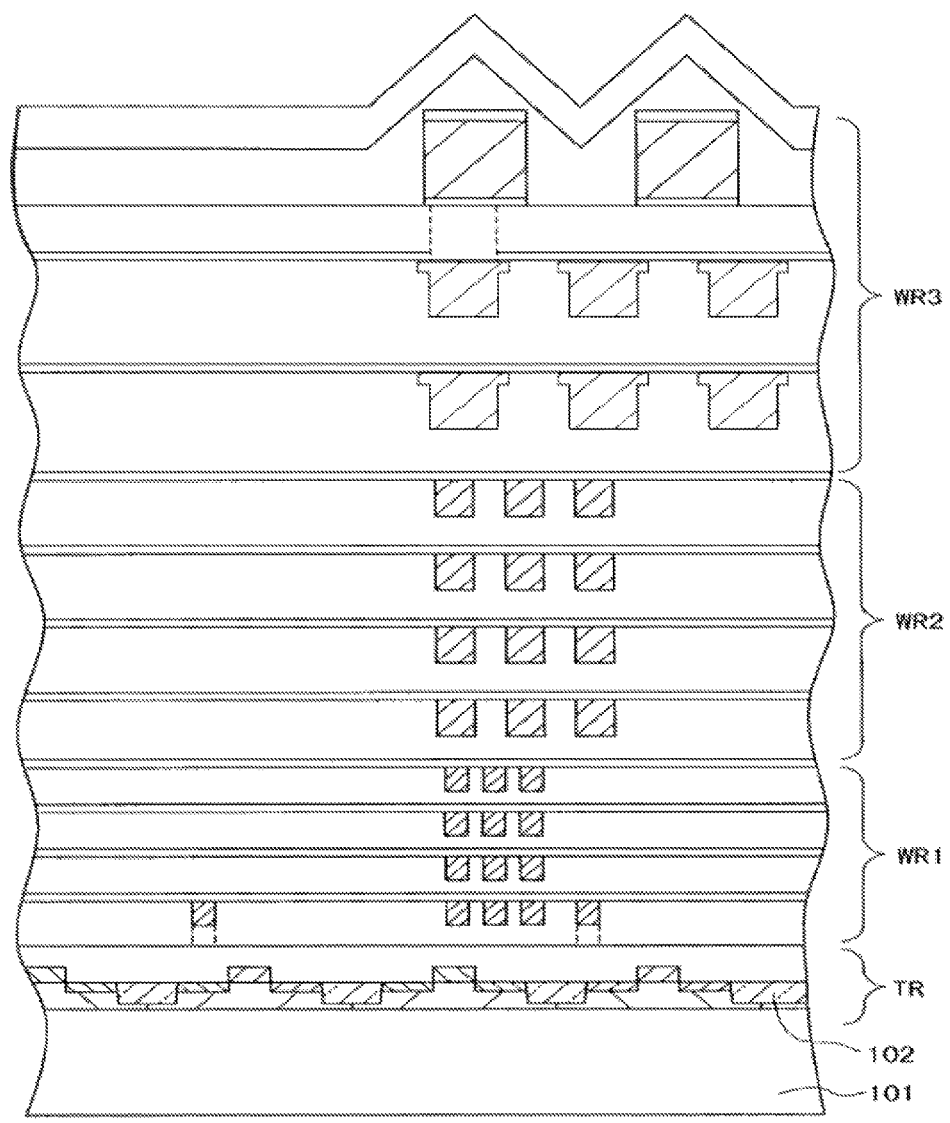
FIG. 14 is a schematic cross section of a semiconductor device with multi-layered wirings.

FIG. 14 illustrates an example of a structure of a semiconductor integrated circuit device. A device isolation region 102 is formed over a Si substrate 101 to define many active regions. In the active region, n-channel MOS transistor, and p-channel MOS transistor are formed. A layer that includes a transistor is called a transistor layer TR. Over the transistor layer TR, a multilayer interlayer insulating film is formed and a multilayer wiring is formed in the multilayer interlayer insulating film. The multilayer wiring is divided into a lower wiring WR1, an intermediate wiring WR2, and an upper wiring WR3. The upper the wiring WR3 is wider and thicker and the pitch is wider than the intermediate wiring WR2, etc. The lower wiring WR1 and the intermediate wiring WR2 may be formed by the copper wiring and the upper wiring WR3 may be formed with a copper wiring and an Al wiring. The wiring according to the above embodiment will be mainly employed for the upper layer wiring.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
   a semiconductor substrate;
   a first insulating cap layer formed over the semiconductor substrate;
   an interlayer insulating film formed over the first insulating cap layer including a via and a trench on the via, the trench including a sidewall of a stepped shape over the via;
   a wiring formed in the trench, the wiring being different from the via; and
   a second insulating cap layer formed over the interlayer insulating film,
   wherein the wiring over the via includes, a main portion with a first thickness provided over the via; and
   an extended portion, provided over the main portion, with a second thickness that is thinner than the first thickness and that extends outward from a side of the main portion,
   a material of the interlayer insulating film is different from a material of the first insulating cap layer and a material of the second insulating cap layer.

2. The semiconductor device according to claim 1, wherein: the extended portion is formed at both sides of the main portion.

3. The semiconductor device according to claim 1, further comprising: a barrier metal film formed between the interlayer insulating film and the main portion.

4. The semiconductor device according to claim 3, wherein: the barrier metal film also is formed between the interlayer insulating film and the extended portion.

5. The semiconductor device according to claim 1, wherein: the wiring includes copper.

6. The semiconductor device according to claim 1, wherein: the first thickness is about 600 nm or more.

7. The semiconductor device according to claim 1, wherein: the second thickness is about 660 nm or less.

8. The semiconductor device according to claim 1, wherein: the extended portion extends about 150 nm or more from the main portion.

9. The semiconductor device according to claim 1, wherein: the wiring includes linear segments and at least one corner part that couples linear segments, wherein the extended portion of the corner part extends further from the corresponding main portion than the extended portion of a linear segment extends from the corresponding main portion.

10. The semiconductor device according to claim 9, wherein: a shape of the extended portion included in the corner part is, in a plan view, generally squared or generally arcuate.

11. The semiconductor device according to claim 1, wherein the wiring is included in an inductor-configuration.

12. The semiconductor device according to claim 11, wherein: the insulating film includes a plurality of metal particulates.

13. The semiconductor device according to claim 1, wherein: the interlayer insulating film includes a first insulating film and a second insulating film, and the first insulating film is in contact with a side of the main portion and the second insulating film is in contact with a side of the extended portion.

14. The semiconductor device according to claim 13, wherein etching characteristics of the first insulating film and the second insulating film differ.

15. The semiconductor device according to claim 1, wherein: the extended portion in a sectional view has a stepped shape and includes first and second sub-portions; the first sub-portion has a third thickness; the second sub-portion has a fourth thickness; each of the third and fourth thicknesses are thinner than the first thickness; and the second sub-portion extends further outward from a side of the main portion than does the first sub-portion.

* * * * *